US012610764B2

(12) United States Patent
Zhang et al.

(10) Patent No.: US 12,610,764 B2
(45) Date of Patent: Apr. 21, 2026

(54) TERMINATION STRUCTURES FOR SEMICONDUCTOR DEVICES

(71) Applicant: Virginia Tech Intellectual Properties, Inc., Blacksburg, VA (US)

(72) Inventors: Yuhao Zhang, Blacksburg, VA (US); Ming Xiao, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 319 days.

(21) Appl. No.: 18/532,725

(22) Filed: Dec. 7, 2023

(65) Prior Publication Data

US 2025/0191928 A1     Jun. 12, 2025

(51) Int. Cl.
| *H01L 21/311* | (2006.01) |
| *H01L 21/225* | (2006.01) |
| *H01L 21/285* | (2006.01) |

(52) U.S. Cl.
CPC .... *H01L 21/31133* (2013.01); *H01L 21/2253* (2013.01); *H01L 21/28537* (2013.01)

(58) Field of Classification Search
CPC ........... H01L 21/31133; H01L 21/2253; H01L 21/28537; H01L 21/28575
USPC ........................................................ 438/745
See application file for complete search history.

(56) References Cited

U.S. PATENT DOCUMENTS

| 7,214,627 B2 | 5/2007 | Merrett et al. |
| 7,759,186 B2 | 7/2010 | Imhoff et al. |

| 8,748,943 B2 | 6/2014 | Gumaelius |
| 8,749,015 B2 | 6/2014 | Disney et al. |
| 8,927,402 B2 | 1/2015 | Zhu et al. |
| 9,064,738 B2 | 6/2015 | Van Brunt et al. |
| 10,861,964 B2 | 12/2020 | Rupp et al. |

(Continued)

FOREIGN PATENT DOCUMENTS

| CN | 107591324 A | * | 1/2018 | |
| CN | 108565222 A | * | 9/2018 | ............. H01L 23/29 |

OTHER PUBLICATIONS

Y. Zhang, F. Udrea, and H. Wang, "Multidimensional device architectures for efficient power electronics," Nature Electron., vol. 5, No. 11, pp. 723-734, Nov. 2022, doi: 10.1038/s41928-022-00860-5.

(Continued)

*Primary Examiner* — Duy Vu N Deo

(74) *Attorney, Agent, or Firm* — Thomas | Horstemeyer, LLP

(57) ABSTRACT

A process for forming a device can include forming a first semiconductor region having a first conductivity type. The process can include depositing a dielectric layer over the first semiconductor region, the dielectric layer having a first etch rate. The process can include forming a first photoresist layer having a second etch rate that is greater than the first etch rate over the dielectric layer and forming a second photoresist layer over the first photoresist layer. The process can include patterning the second photoresist layer to remove a region of the second photoresist, the first photoresist layer being exposed under the region. The process can include etching to form a beveled structure in the dielectric layer. The process can include removing the first photoresist layer and the second photoresist layer and performing ion implantation of the first semiconductor region with dopant species having a second conductivity type.

15 Claims, 14 Drawing Sheets

(56) References Cited

U.S. PATENT DOCUMENTS

| | | | |
|---|---|---|---|
| 11,018,008 B2 | 5/2021 | Zanetti et al. | |
| 2017/0018612 A1* | 1/2017 | Ito | H01L 21/283 |
| 2019/0096991 A1* | 3/2019 | Niwa | H01L 21/02458 |
| 2019/0172715 A1* | 6/2019 | Zanetti | H10D 12/031 |

OTHER PUBLICATIONS

K. Nomoto, Z. Hu, B. Song, M. Zhu, M. Qi, R. Yan, V. Protasenko, E. Imhoff, J. Kuo, N. Kaneda, T. Mishima, T. Nakamura, D. Jena, and H. G. Xing, "GaN-on-GaN p-n power diodes with 3.48 kV and 0.95 m-cm2: A record high figure-of-merit of 12.8 GW/cm2," in IEDM Tech. Dig., Dec. 2015.

Z. Bian, K. Zeng, and S. Chowdhury, "2.8 kV avalanche in vertical GaN PN diode utilizing field plate on hydrogen passivated P-layer," IEEE Electron Device Lett., vol. 43, No. 4, pp. 596-599, Apr. 2022.

H. Fukushima, S. Usami, M. Ogura, Y. Ando, A. Tanaka, M. Deki, M. Kushimoto, S. Nitta, Y. Honda, and H. Amano, "Vertical GaN p-n diode with deeply etched mesa and the capability of avalanche breakdown," Appl. Phys. Exp., vol. 12, No. 2, Feb. 2019.

T. Maeda, T. Narita, H. Ueda, M. Kanechika, T. Uesugi, T. Kachi, T. Kimoto, M. Horita, and J. Suda, "Design and fabrication of GaN p-n junction diodes with negative beveled-mesa termination," IEEE Electron Device Lett., vol. 40, No. 6, pp. 941-944, Jun. 2019.

B. Shankar, Z. Bian, K. Zeng, C. Meng, R. P. Martinez, S. Chowdhury, B. Gunning, J. Flicker, A. Binder, J. R. Dickerson, and R. Kaplar, "Study of avalanche behavior in 3 KV GaN vertical P-N diode under UIS stress for edge-termination optimization," in Proc. IEEE Int. Rel. Phys. Symp. (IRPS), Mar. 2022, p. 2B.

D. Ji, S. Li, B. Ercan, C. Ren, and S. Chowdhury, "Design and fabrication of ion-implanted moat etch termination resulting in 0.7 M Ohm cm2/1500 V GaN diodes," IEEE Electron Device Lett., vol. 41, No. 2, pp. 264-267, Feb. 2020.

H. Ohta, N. Asai, F. Horikiri, Y. Narita, T. Yoshida, and T. Mishima, "Two-step mesa structure GaN p-n diodes with low ON-resistance, high breakdown voltage, and excellent avalanche capabilities," IEEE Electron Device Lett., vol. 41, No. 1, pp. 123-126, Jan. 2020.

Y. Bai, W. Xu, F. Zhou, Y. Wang, L. Guo, F. Ren, D. Zhou, D. Chen, R. Zhang, Y. Zheng, and H. Lu, "Over 10 kA/cm2 inductive current sustaining capability demonstrated in GaN-on-GaN pn junction with high ruggedness," Micro Nanostruct., vol. 170, Oct. 2022.

Pandey, T. M. Nelson, W. M. Collings, M. R. Hontz, D. G. Georgiev, A. D. Koehler, T. J. Anderson, J. C. Gallagher, G. M. Foster, A. Jacobs, M. A. Ebrish, B. P. Gunning, R. J. Kaplar, K. D. Hobart, and R. Khanna, "A simple edge termination design for vertical GaN P-N diodes," IEEE Trans. Electron Devices, vol. 69, No. 9, pp. 5096-5103, Sep. 2022.

H. Fu, K. Fu, S. R. Alugubelli, C.-Y. Cheng, X. Huang, H. Chen, T.-H. Yang, C. Yang, J. Zhou, J. Montes, X. Deng, X. Qi, S. M. Goodnick, F. A. Ponce, and Y. Zhao, "High voltage vertical GaN p-n diodes with hydrogen-plasma based guard rings," IEEE Electron Device Lett., vol. 41, No. 1, pp. 127-130, Jan. 2020.

M. Matys, T. Ishida, K. P. Nam, H. Sakurai, K. Kataoka, T. Narita, T. Uesugi, M. Bockowski, T. Nishimura, J. Suda, and T. Kachi, "Design and demonstration of nearly-ideal edge termination for GaN p-n junction using mg-implanted field limiting rings," Appl. Phys. Exp., vol. 14, No. 7, Jun. 2021.

V. Talesara, Y. Zhang, V. G. T. Vangipuram, H. Zhao, and W. Lu, "Vertical GaN-on-GaN pn power diodes with baliga figure of merit of 27 GW/cm2," Appl. Phys. Lett., vol. 122, No. 12, Mar. 2023.

J. R. Dickerson, A. A. Allerman, B. N. Bryant, A. J. Fischer, M. P. King, M. W. Moseley, A. M. Armstrong, R. J. Kaplar, I. C. Kizilyalli, O. Aktas, and J. J. Wierer, "Vertical GaN power diodes with a bilayer edge termination," IEEE Trans. Electron Devices, vol. 63, No. 1, pp. 419-425, Jan. 2016.

I. C. Kizilyalli, A. P. Edwards, H. Nie, D. Disney, and D. Bour, "High voltage vertical GaN p-n diodes with avalanche capability," IEEE Trans. Electron Devices, vol. 60, No. 10, pp. 3067-3070, Oct. 2013.

J. Wang, L. Cao, J. Xie, E. Beam, R. McCarthy, C. Youtsey, and P. Fay, "High voltage, high current GaN-on-GaN p-n diodes with partially compensated edge termination," Appl. Phys. Lett., vol. 113, No. 2, Jul. 2018.

J. Liu, M. Xiao, R. Zhang, S. Pidaparthi, C. Drowley, L. Baubutr, A. Edwards, H. Cui, C. Coles, and Y. Zhang, "Trap-mediated avalanche in large-area 1.2 kV vertical GaN p-n diodes," IEEE Electron Device Lett., vol. 41, No. 9, pp. 1328-1331, Sep. 2020.

W. Lin, M. Wang, R. Yin, J. Wei, C. P. Wen, B. Xie, Y. Hao, and B. Shen, "Hydrogen-modulated step graded junction termination extension in GaN vertical p-n diodes," IEEE Electron Device Lett., vol. 42, No. 8, pp. 1124-1127, Aug. 2021.

J. Liu, R. Zhang, M. Xiao, S. Pidaparthi, H. Cui, A. Edwards, L. Baubutr, C. Drowley, and Y. Zhang, "Surge current and avalanche ruggedness of 1.2-kV vertical GaN p-n diodes," IEEE Trans. Power Electron., vol. 36, No. 10, pp. 10959-10964, Oct. 2021.

D. Johannesson, M. Nawaz, and H.-P. Nee, "Assessment of junction termination extension structures for ultrahigh-voltage silicon carbide pin-diodes; a simulation study," IEEE Open J. Power Electron., vol. 2, pp. 304-314, May 2021.

E. A. Imhoff, F. J. Kub, K. D. Hobart, M. G. Ancona, B. L. VanMil, D. K. Gaskill, K.-K. Lew, R. L. Myers-Ward, and C. R. Eddy, "Highperformance smoothly tapered junction termination extensions for high voltage 4H-SiC devices," IEEE Trans. Electron Devices, vol. 58, No. 10, pp. 3395-3400, Oct. 2011.

B. Wang, M. Xiao, J. Spencer, Y. Qin, K. Sasaki, M. J. Tadjer, and Y. Zhang, "2.5 kV vertical Ga2O3 Schottky rectifier with graded junction termination extension," IEEE Electron Device Lett., vol. 44, No. 2, pp. 221-224, Feb. 2023.

J. P. Kozak, R. Zhang, M. Porter, Q. Song, J. Liu, B. Wang, R. Wang, W. Saito, and Y. Zhang, "Stability, reliability, and robustness of GaN power devices: A review," IEEE Trans. Power Electron., vol. 38, No. 7, pp. 8442-8471, Jul. 2023.

K. Zeng and S. Chowdhury, "Designing beveled edge termination in GaN vertical p-i-n diode-bevel angle, doping, and passivation," IEEE Trans. Electron Devices, vol. 67, No. 6, pp. 2457-2462, Jun. 2020.

P. Saint-Cast, D. Kania, M. Hofmann, J. Benick, J. Rentsch, and R. Preu, "Very low surface recombination velocity on p-type c-Si by high-rate plasma-deposited aluminum oxide," Appl. Phys. Lett., vol. 95, No. 15, Oct. 2009.

D. Tetzlaff, M. Dzinnik, J. Krügener, Y. Larionova, S. Reiter, M. Turcu, R. Peibst, U. H.hne, J.-D. K.hler, and T. F. Wietler, "Introducing pinhole magnification by selective etching: Application to poly-Si on ultra-thin silicon oxide films," Energy Proc., vol. 124, pp. 435-440, Sep. 2017.

J. Q. Han, R. S. Feng, and X. F. Wang, "Wet etching studies of PECVD silicon nitride films in doped TMAH solutions," Adv. Mater. Res., vol. 465, pp. 1-7, Feb. 2012.

R. Zhang, J. P. Kozak, M. Xiao, J. Liu, and Y. Zhang, "Surge-energy and overvoltage ruggedness of P-gate GaN HEMTs," IEEE Trans. Power Electron., vol. 35, No. 12, pp. 13409-13419, Dec. 2020.

D. Ji, B. Ercan, and S. Chowdhury, "Experimental determination of impact ionization coefficients of electrons and holes in gallium nitride using homojunction structures," Appl. Phys. Lett., vol. 115, No. 7, Aug. 2019.

A. Castiglia, J.-F. Carlin, and N. Grandjean, "Role of stable and metastable Mg-H complexes in p-type GaN for cw blue laser diodes," Appl. Phys. Lett., vol. 98, No. 21, May 2011.

J. A. Cooper and D. T. Morisette, "Performance limits of vertical unipolar power devices in GaN and 4H-SiC," IEEE Electron Device Lett., vol. 41, No. 6, pp. 892-895, Jun. 2020.

* cited by examiner

1

TERMINATION STRUCTURES FOR SEMICONDUCTOR DEVICES

STATEMENT REGARDING FEDERALLY SPONSORED RESEARCH OR DEVELOPMENT

This invention was made with government support under grant number DE-AR0001008, awarded by the Advanced Research Projects Agency. The government has certain rights in the invention.

TECHNICAL FIELD

This disclosure relates to the semiconductor devices, and in particular to termination structures in semiconductor devices.

DESCRIPTION OF THE RELATED TECHNOLOGY

The breakdown voltage of power semiconductor devices refers to the maximum voltage that a device can withstand across its terminals without experiencing a breakdown or catastrophic failure. It is a critical parameter in the design and operation of these devices, as exceeding the breakdown voltage can lead to the formation of a conducting path through the device, causing it to lose its ability to control the flow of electrical current.

In power semiconductor devices such as diodes, transistors, and thyristors, the breakdown voltage is a crucial specification that determines the device's reliability and performance. There are different types of breakdown mechanisms, depending on the specific device and its construction. For example, common breakdown mechanisms include avalanche breakdown and Zener breakdown. Avalanche breakdown occurs in devices such as power diodes and some transistors when carriers gain enough energy to create additional charge carriers through collisions, leading to a rapid increase in current. Zener breakdown, on the other hand, is characteristic of devices like Zener diodes and occurs when carriers tunnel through the semiconductor's energy barrier.

Commercial power devices, and in particular power devices utilizing Gallium nitride (GaN) can have operation voltages in the hundreds of volts. Edge termination can be an important factor determining the reverse breakdown voltage of the power devices.

SUMMARY

In some aspects, the techniques described herein relate to a method, including: forming a first semiconductor region having a first conductivity type, the first conductivity type being one of a p-type conductivity and a n-type conductivity; depositing a dielectric layer over the first semiconductor region, the dielectric layer having a first etch rate; forming a first photoresist layer over the dielectric layer, the first photoresist layer having a second etch rate that is greater than the first etch rate of the dielectric layer; forming a second photoresist layer over the first photoresist layer; patterning the second photoresist layer to remove a region of the second photoresist, the first photoresist layer being exposed under the region; wet etching the first photoresist layer and the dielectric layer to form a beveled structure in the dielectric layer; removing the first photoresist layer and the second photoresist layer; and performing ion implantation of the first semiconductor region from a direction facing the dielectric layer with dopant species having a second conductivity type, the second conductivity type being different from the first conductivity type and the other of the p-type conductivity and the n-type conductivity.

In some aspects, the techniques described herein relate to a method, including: prior to performing ion implantation, depositing a third photoresist layer over the dielectric layer, the third photoresist layer being patterned to expose at least a portion of the beveled structure in the dielectric layer.

In some aspects, the techniques described herein relate to a method, wherein the beveled structure extends between a top surface of the first semiconductor region and a top surface of the dielectric layer that was positioned under un-etched portions of the first photoresist layer, the method including: prior to performing ion implantation, depositing a third photoresist layer over the dielectric layer, the third photoresist layer being patterned to expose the beveled structure and at least a portion of the top surface of the dielectric layer.

In some aspects, the techniques described herein relate to a method, including: prior to performing ion implantation, depositing a third photoresist layer over the dielectric layer and a fourth photoresist layer over the third photoresist layer, patterning the third photoresist layer and the fourth photoresist layer to expose at least a portion of the beveled structure in the dielectric layer.

In some aspects, the techniques described herein relate to a method, wherein the beveled structure extends between a top surface of the first semiconductor region and a top surface of the dielectric layer that was positioned under un-etched portions of the first photoresist layer, the method including: prior to performing ion implantation, depositing a third photoresist layer over the dielectric layer and a fourth photoresist layer over the third photoresist layer, the third photoresist layer and the fourth photoresist layer being patterned to expose the beveled structure and at least a portion of the top surface of the dielectric layer.

In some aspects, the techniques described herein relate to a method, including: after performing ion implantation, removing the dielectric layer to expose the first semiconductor region having a semiconductor beveled structure with the first conductivity type and a remainder of the first semiconductor region being nonconductive, the semiconductor beveled structure having a substantially flat top surface; depositing and patterning a metal over the top surface of the semiconductor beveled structure to form a first terminal, the first terminal forming an ohmic contact with the semiconductor beveled structure.

In some aspects, the techniques described herein relate to a method, including: forming the first semiconductor region over a top surface of a second semiconductor region, the second semiconductor region having the second conductivity type; after performing ion implantation, removing the dielectric layer to expose the first semiconductor region having a semiconductor beveled structure with the first conductivity type, the semiconductor beveled structure having a top surface; depositing a semiconductor patterning photoresist over the first semiconductor region, the semiconductor patterning photoresist being patterned to expose a portion of the top surface of the semiconductor beveled structure; etching the exposed portion of the top surface of the semiconductor beveled structure to expose the top surface of the second semiconductor region; removing the semiconductor patterning photoresist; and depositing and patterning a metal over the top surface of the second semiconductor region and the top surface of the semiconductor beveled structure, the metal forming a Schottky contact with the first semiconductor region and the second semiconductor region.

In some aspects, the techniques described herein relate to a method, including: forming in the first semiconductor region, by the ion implantation, a semiconductor beveled structure having the second conductivity type, the semiconductor beveled structure having a top surface, a bottom surface, and a bevel slope surface that extends between the top surface and the bottom surface, wherein the top surface is wider than the bottom surface, wherein at a first portion of the top surface of the semiconductor beveled structure is covered by the beveled structure of the dielectric layer and a second portion of the top surface of the semiconductor beveled structure is not covered by the dielectric layer.

In some aspects, the techniques described herein relate to a method, wherein an angle formed by the bevel slope surface in relation to the top surface is less than or equal to 0.1 degree.

In some aspects, the techniques described herein relate to a method, including: after performing ion implantation, removing the dielectric layer to expose the top surface of the semiconductor beveled structure; depositing and patterning a metal over the top surface of the semiconductor beveled structure, the metal forming an ohmic contact with the semiconductor beveled structure.

In some aspects, the techniques described herein relate to a method, wherein the beveled structure in the dielectric layer exposes a portion of a top surface of the first semiconductor region, the method including: prior to performing ion implantation, depositing and patterning a third photoresist layer to cover the portion of the top surface of the first semiconductor region exposed by the dielectric layer; performing ion implantation with the third photoresist layer in place and forming a semiconductor beveled structure having the second conductivity type, the semiconductor beveled structure having a top surface adjacent to the portion of the top surface of the first semiconductor region positioned under the third photoresist layer, a bottom surface, and a bevel slope surface extending between the top surface and the bottom surface of the semiconductor beveled structure; after performing ion implantation, removing the third photoresist layer to expose the portion of the top surface of the first semiconductor region; depositing and patterning a metal over the top surface of the first semiconductor region and the top surface of the semiconductor beveled structure, the metal forming a Schottky contact with the first semiconductor region and the semiconductor beveled structure.

In some aspects, the techniques described herein relate to a method, wherein the first semiconductor region includes gallium nitride.

In some aspects, the techniques described herein relate to a method, wherein the beveled structure of the dielectric layer is substantially circular in shape when viewed in a direction normal to the dielectric layer.

In some aspects, the techniques described herein relate to a method, wherein the beveled structure of the dielectric layer is substantially rectangular in shape when viewed in a direction normal to the dielectric layer.

In some aspects, the techniques described herein relate to a method, wherein an angle formed by the beveled structure is less than or equal to 0.1 degree.

BRIEF DESCRIPTION OF THE DRAWINGS

Like reference numbers and designations in the various drawings indicate like elements.

DETAILED DESCRIPTION

Figures 1, 2:
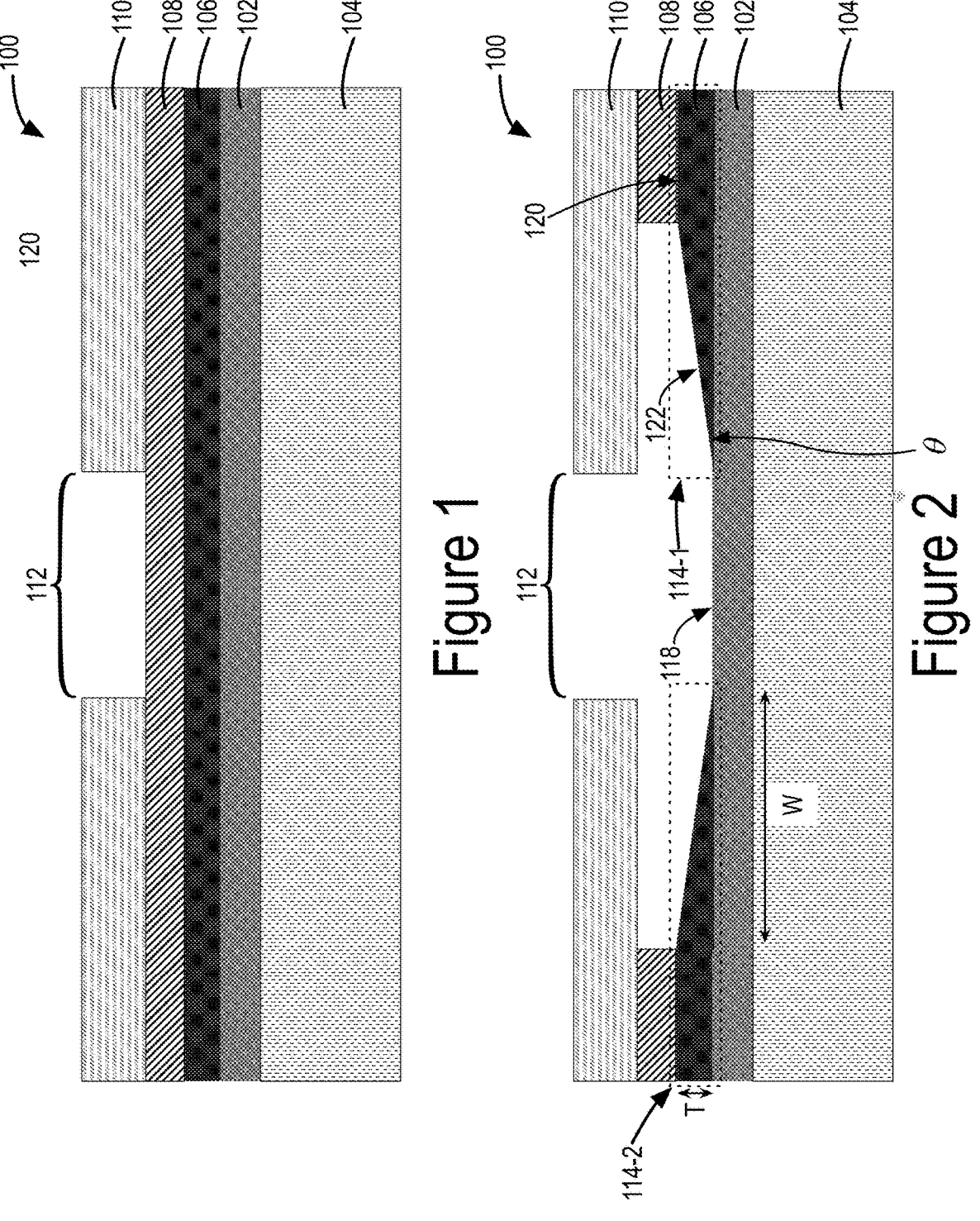
FIG. 1 shows a cross-sectional view of a portion of an example semiconductor device at an example stage of fabrication.
FIG. 2 shows a cross-sectional view of a portion of the example semiconductor device after wet etching.

The various concepts introduced above and discussed in greater detail below may be implemented in any of numerous ways, as the described concepts are not limited to any particular manner of implementation. Examples of specific implementations and applications are provided primarily for illustrative purposes.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Prior to describing the various aspects of the present disclosure, the following definitions are provided and should be used unless otherwise indicated. Additional terms may be defined elsewhere in the present disclosure.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used herein, the term "and/or" includes any and all combinations of one or more of the associated listed items. Expressions such as "at least one of," when preceding a list of elements, modify the entire list of elements and do not modify the individual elements of the list.

As used in the specification and the appended claims, the singular forms "a," "an" and "the" include plural referents unless the context clearly dictates otherwise. Thus, for example, reference to "a proton beam degrader," "a degrader foil," or "a conduit," includes, but is not limited to, two or more such proton beam degraders, degrader foils, or conduits, and the like.

The various concepts introduced above and discussed in greater detail below may be implemented in any of numerous ways, as the described concepts are not limited to any particular manner of implementation. Examples of specific implementations and applications are provided primarily for illustrative purposes.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere).

Gallium nitride (GaN) power devices have been commercialized up to several hundred volts. Vertical GaN devices are under extensive development for kilovolt applications. Edge termination is an important building block of vertical power devices to laterally spread the crowded electric field (E-field) at the electrode edge and enable high breakdown voltage (BV). Several edge termination designs, including field plate, deep or bevel mesa, isolation implant, guard ring, junction termination extension (JTE), and their combinations, can be utilized in vertical GaN p-n diodes. JTEs are featured by a decreased charge density away from the active region, which allows for higher efficiency and broader design space as compared to the single-zone (non-graded) JTE.

In some instances, the fabrication of GaN JTEs can be more challenging than SiC and Si, due to difficulties in p-type implantation or diffusion. Some conventional GaN JTE fabrication mostly relies on the compensation implant into an epitaxial p-GaN to form a single-zone JTE, which suffers from small process windows (e.g., requiring precise control of the implant depth down to 10 nm). On the other hand, the graded charge profile has only been enabled by the beveled etch instead of implantation in GaN.

In addition to high BV, edge termination is also the key to enabling avalanche capability, which allows devices to pass a high avalanche current ($I_{AVA}$) at BV.

The processes and devices discussed herein provide novel, etch-free, single-implant GaN JTE that has a graded charge profile and enables the circuit-level avalanche. A tapered dielectric layer with an ultra-small bevel angle can be produced, which serves as the mask for ion implantation to compensate the p-GaN. The produced bevel JTE can be embedded in bulk GaN and far from the surface. Therefore, its effectiveness is insensitive to the interface charge commonly introduced by the passivation.

FIG. 1 shows a cross-sectional view of a portion of an example semiconductor device 100 at an example stage of fabrication. In particular, FIG. 1 shows an intermediate stage of a fabrication process for formation of the semiconductor device 100. The process includes forming a first semiconductor region 102 having a first conductivity type. In some instances, the first semiconductor region 102 can include gallium nitride (GaN). In some other instances, the first semiconductor region 102 can include other semiconductor materials such as, for example, gallium oxide, silicon carbide, aluminum nitride, aluminum gallium nitride, and silicon. The first semiconductor region 102 can have a first conductivity type, which can be one of a p-type conductivity and a n-type conductivity. Generally, in the formation of the first semiconductor region 102, the first semiconductor region 102 can be doped with impurities to achieve the desired type of conductivity. For example, where the first semiconductor region 102 is formed of GaN, silicon or germanium can be used as dopants for n-type doping and magnesium can be used for p-type doping. Of course, these are only examples, and other types of suitable materials can also be used. In some examples, the first semiconductor region 102 can have a thickness between about 10 nm and about 10 μm.

The process also includes depositing a dielectric layer 106 over the first semiconductor region 102. The dielectric layer 106 can include, for example, aluminum oxide, silicon dioxide, silicon-on-glass (SOG), or other suitable insulating materials. In some examples, the dielectric layer 106 can be deposited using atomic layer deposition (ALD). In some other examples, the dielectric layer 106 can be deposited using plasma enhanced chemical vapor deposition (PE-VCD), however, other vapor deposition techniques could also be used. The dielectric layer 106 can have a first etch rate, which can refer to the rate at which the dielectric layer 106 is removed during an etching process. In some examples, the dielectric layer 106 can have a thickness of about 10 nm to about 2 μm.

The process further includes forming a first photoresist layer 108 over the dielectric layer 106. The first photoresist layer 108 can have a second etch rate that is greater than the first etch rate of the dielectric layer 106. The first etch rate and the second etch rate can be specified for the same type of etching. For example, for a wet etching process using a particular etchant, the second etch rate of the first photoresist layer 108 can be greater than the first etch rate of the dielectric layer 106. As an example, aluminum oxide, used for forming the dielectric layer 106, can have an etch rate of approximately 1.2 nm/min and polydimethylglutarimide (PMGI), used for forming the first photoresist layer 108, can have an etch rate of approximately 750 nm/min for a wet etching process using 2.38% tetramethylammonium hydroxide (TMAH) solution. In some examples, the first photoresist layer 108 can have a thickness of about 0.1 μm to about 5 μm.

The process further includes forming a second photoresist layer 110 over the first photoresist layer 108 and patterning the second photoresist layer 110 to remove a region 112 of the second photoresist layer 110 to expose a portion of the underlying first photoresist layer 108. In some instances, the material of the second photoresist layer 110 can be different from the material of the first photoresist layer 108. Specifically, the materials can be chosen such that the second photoresist layer 110 is resistant to an etchant that can etch the first photoresist layer 108. For example, the first photoresist layer 108 can be formed of PMGI and the second photoresist layer 110 can be formed of AZ3330F materiel. In some examples, the thickness of the second photoresist layer 110 can be greater than the thickness of the first photoresist layer 108. In some examples, the thickness of the second photoresist layer 110 can be about 0.1 μm to about 5 μm.

The process further includes wet etching the first photoresist layer 108 and the dielectric layer 106 to form a beveled structure 114 in the dielectric layer 106. FIG. 2 shows a cross-sectional view of a portion of the example semiconductor device 100 after wet etching. As mentioned above, the second etch rate of the first photoresist layer 108 can be greater than the first etch rate of the dielectric layer 106. When the semiconductor device 100 shown in FIG. 1 is exposed to a wet etchant, the first photoresist layer 108 is initially etched away to expose the underlying dielectric layer 106. Thereafter, the first photoresist layer 108 etches laterally under the second photoresist layer 110 while at the same time exposing more of the dielectric layer 106 to the etchant. The dielectric layer 106 itself is etched by the etchant, but at a rate that is less than that of the first photoresist layer 108. This difference in etch rates results in different rates of lateral and vertical etching of the dielectric layer 106. This results in the formation of a first beveled structure 114-1 and a second beveled structure 114-2 (the two beveled structures are singularly referred to as the beveled structure 114). With continued etching, a top surface 118 of the underlying first semiconductor region 102 is exposed between the two beveled structures. The beveled structure 114 includes a bevel slope surface 122 that extends between the top surface 118 of the first semiconductor region 102 and a top surface 120 of the dielectric layer 106. As the etch rates of the first photoresist layer 108 and the first semiconductor region 102 remain constant, the bevel slope surface 122 is substantially linear. The beveled structure 114 can have a width W and a thickness T, where the width W and the thickness T represent the projection of the bevel slope surface 122 on the horizontal and the vertical dimensions, respectively. The bevel slope surface 122 forms an angle θ with the top surface 118 of the first semiconductor region 102 (or alternatively with the bottom surface of the dielectric layer 106). The magnitude of the angle θ can be a function of the ratio of the first etch rate of the first photoresist layer 108 and the second etch rate of the dielectric layer 106. In some instances, the angle θ can be less than or equal to 0.1 degrees.

Figures 3, 4:
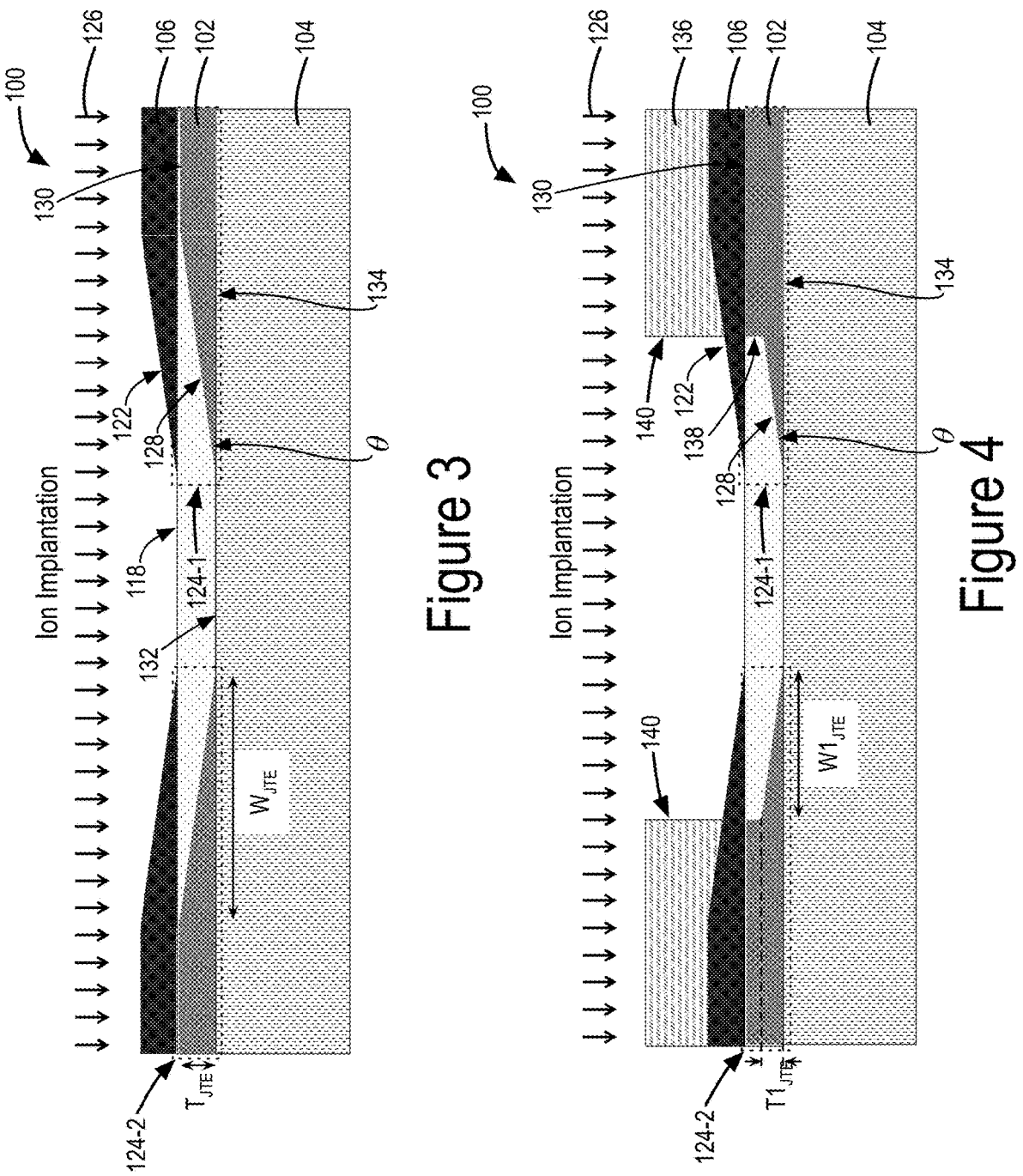
FIG. 3 shows a cross-sectional view of a portion of the example semiconductor device after performing ion implantation.
FIG. 4 shows a cross-sectional view of a portion of the example semiconductor device after the deposition of a third photoresist layer.

The process further includes removing the first photoresist layer and the second photoresist layer, and performing ion implantation of the first semiconductor region 102 from a direction facing the dielectric layer 106 with dopant species having a second conductivity type, where the second conductivity type is different from the first conductivity type of the first semiconductor region 102. FIG. 3 shows a cross-sectional view of a portion of the example semiconductor device 100 after performing ion implantation. In relation to FIG. 2, FIG. 3 shows that the first photoresist layer 108 and the second photoresist layer 110 are removed from the top surface 120 of the dielectric layer 106. The remaining dielectric layer 106 with the beveled structure 114 can form a mask for the ion implantation. The ion implantation can be carried out from a direction 126 facing the dielectric layer 106. The implanted ions can include dopant species having a second conductivity type, where the second conductivity type is different from the first conductivity type of the first semiconductor region 102. For example, if the first conductivity type is p-type (n-type), the second conductivity type of the dopant species is n-type (p-type). For example, the ion implantation can implant nitrogen ions in a p-type first semiconductor region 102. In instances where the dielectric layer 106 were absent, the ion implantation would uniformly implant the dopant onto the first semiconductor region 102. However, the beveled structure 114 of the dielectric layer 106 causes a formation of a semiconductor beveled structure 124 within the first semiconductor region 102. The semiconductor beveled structure 124 retains the first conductivity type of the first semiconductor region 102, while the remainder of the first semiconductor region 102 is transformed to being nonconductive.

The semiconductor beveled structure 124 can have a structural profile that is similar to that of the beveled structure 114 in the dielectric layer 106. As discussed herein, the semiconductor beveled structure 124 can be utilized as a junction termination extension (JTE) of a semiconductor device. The semiconductor beveled structure 124 can include a bevel slope surface 128 that extends between a top surface 130 of the semiconductor beveled structure 124 and the top surface 132 of an underlying second semiconductor region 104 (or the bottom surface 134 of the semiconductor beveled structure 124). The bevel slope surface 128 can be a smooth and linear surface and can form an angle θ with the top surface 132 of the underlying second semiconductor region 104 or the bottom surface 134 of the semiconductor beveled structure 124. The angle θ formed between the bevel slope surface 128 and the bottom surface 134 can be similar in magnitude to the angle θ formed between the bevel slope surface 122 of the beveled structure 114 in the dielectric layer 106 and the top surface 118 of the first semiconductor region 102. For example, the angle θ can be less than or equal to 0.1 degrees. The semiconductor beveled structure 124 can have a width $W_{JTE}$ that is substantially greater than the thickness $T_{JTE}$. The width and thickness of the semiconductor beveled structure 124 can represent the projection of the bevel slope surface 128 on the horizontal and the vertical dimensions, respectively.

In some examples, prior to performing ion implantation, the process can include depositing a third photoresist layer over the dielectric layer 106. FIG. 4 shows a cross-sectional view of a portion of the example semiconductor device 100 after the deposition of a third photoresist layer 136. The third photoresist layer 136 can be patterned to cover at least a portion of the bevel slope surface 122 of the beveled structure 114 in the dielectric layer 106. For example, after patterning, the third photoresist layer 136 forms a sidewall 140 that is positioned over the bevel slope surface 122 of the dielectric layer 106. The combination of the exposed bevel slope surface 122 in the dielectric layer 106 and the third photoresist layer 136 can form a mask for ion implantation. After the subsequent ion implantation, the semiconductor beveled structure 124 is formed in the first semiconductor region 102. In particular, the semiconductor beveled structure 124 includes a vertical sidewall 138 that extends between the top surface 130 of the semiconductor beveled structure 124 and the bevel slope surface 128. The thickness of the JTE can be the thickness of the beveled portion of the semiconductor beveled structure 124, i.e., the height of the bevel slope surface 128. As can be seen in FIG. 4, the $T1_{JTE}$ is less than the $T_{JTE}$ of the example shown in FIG. 3, where a third photoresist layer is not employed. In this manner, additional process steps such as including a patterned third photoresist layer 136 can be employed to select the desired thickness of the JTE.

Figures 5, 6:
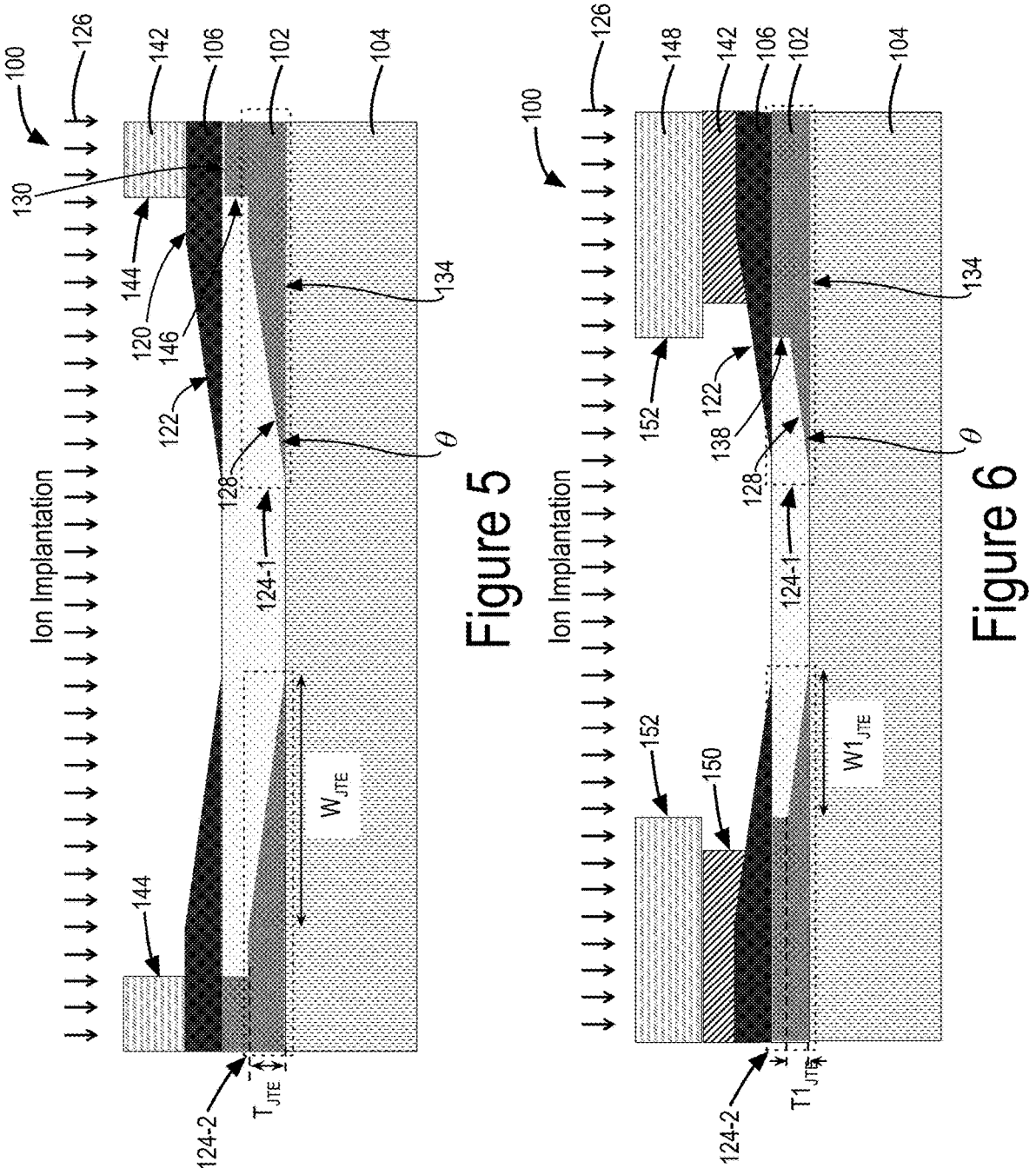
FIG. 5 shows a cross-sectional view of a portion of the example semiconductor device after the deposition of another example third photoresist layer.
FIG. 6 shows a cross-sectional view of a portion of the example semiconductor device after the deposition and patterning of two layers of photoresist.

FIG. 5 shows a cross-sectional view of a portion of the example semiconductor device 100 after the deposition of another example third photoresist layer 142. The process stage show in FIG. 5 is similar that shown in FIG. 4, the difference being that the photoresist layer 142 utilized in the process stage shown in FIG. 5 is patterned to expose the beveled structure 114 and at least a portion of the top surface 120 of the dielectric layer 106. For example, the third photoresist layer 142 is patterned such that the sidewalls 144 of the third photoresist layer 142 extend to the top surface 120 of the dielectric layer 106. The combination of the third photoresist layer 142 and the dielectric layer 106 can form a mask during ion implantation of the first semiconductor region 102. After ion implantation, the semiconductor beveled structure 124 formed in the first semiconductor region 102 can have the bevel slope surface 128 that extends between the bottom surface 134 of the first semiconductor region 102 and an intermediate surface that is substantially parallel to the bottom surface 134 of the first semiconductor region 102. In addition, a sidewall 146 extends between the intermediate surface and the top surface 130 of the first semiconductor region 102. FIGS. 4 and 5 demonstrate that the shape and size of the semiconductor beveled structure 124 can be modified based on the utilization of a photoresist layer with various degrees of coverage.

FIG. 6 shows a cross-sectional view of a portion of the example semiconductor device 100 after the deposition and patterning of two layers of photoresist. In particular, the process includes depositing and patterning a third photoresist layer 142 over the dielectric layer 106 and a fourth photoresist layer 148 over the third photoresist layer 142. The third photoresist layer 142 and the fourth photoresist layer 148 can be patterned to expose the beveled structure 114 in the dielectric layer 106. In particular, the third photoresist layer 142 and the fourth photoresist layer 148 can be patterned to form a third photoresist layer sidewall 150 and a fourth photoresist layer sidewall 152. In the example shown in FIG. 6, the third photoresist layer sidewall 150 extends between the bevel slope surface 122 and a bottom surface of the fourth photoresist layer 148. Further, the fourth photoresist layer 148 is patterned such that the fourth photoresist layer sidewall 152 extends beyond the third photoresist layer sidewall 150 in the horizontal dimension. The combination of the dielectric layer 106, the third photoresist layer 142 and the fourth photoresist layer 148 form a mask for the ion implantation of the first semiconductor region 102. The subsequent ion implantation causes the semiconductor beveled structure 124 to form in the first semiconductor region 102. The semiconductor beveled structure 124 shown in FIG. 6 is similar to the semiconductor beveled structure 124 discussed herein in relation to FIG. 4. Unlike the process discussed in relation to FIG. 4, which included a single layer of photoresist, the dual layer photoresist employed in the process stage shown in FIG. 6 has the benefit of ease of removal of the photoresist after ion implantation. Generally, ion implantation can harden the photoresist material, which can increase the difficulty in removing the photoresist from over the dielectric layer 106 after the completion of ion implantation. By using two layers of photoresist, the third photoresist layer 142, which is in contact with the dielectric layer 106 and fully covered by the fourth photoresist layer 148, is protected from the high energy of the ion implantation by the fourth photoresist layer sidewall 152. As such, the third photoresist layer 142 does not harden and can be easily removed after ion implantation.

Figure 7:
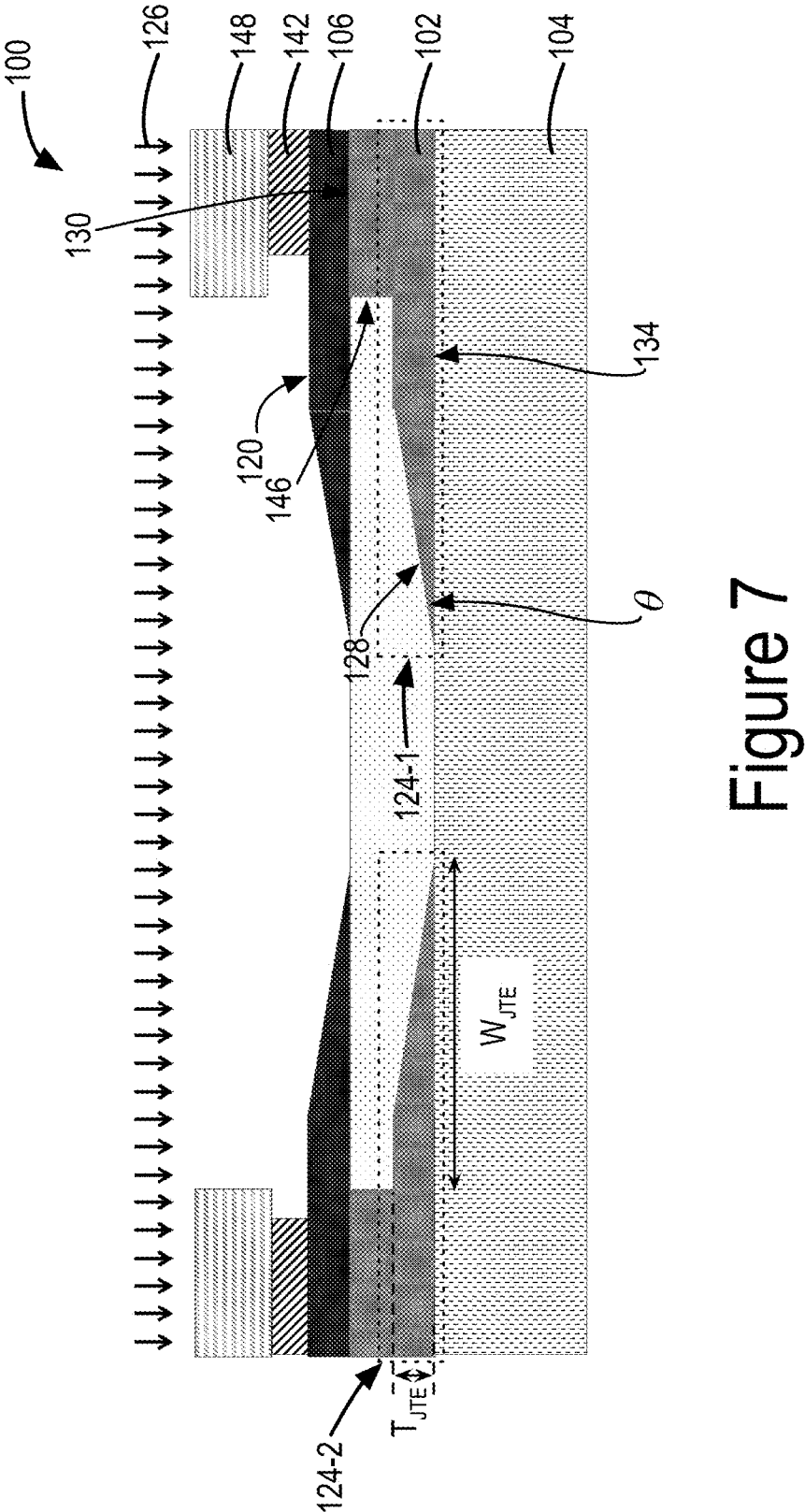
FIG. 7 a cross-sectional view of a portion of the example semiconductor device after the deposition and patterning of two layers of photoresist patterned to expose a top surface of the dielectric layer.

FIG. 7 a cross-sectional view of a portion of the example semiconductor device 100 after the deposition and patterning of two layers of photoresist patterned to expose a top surface of the dielectric layer. In particular, the process stage shown in FIG. 7 is similar to the process stage shown in FIG. 5, except that while FIG. 5 shows only a single photoresist layer (the third photoresist layer 142) deposited over the dielectric layer 106, FIG. 7 shows two photoresist layers: the third photoresist layer 142 and the fourth photoresist layer 148 deposited and patterned over the dielectric layer 106. The third photoresist layer 142 is fully covered by the fourth photoresist layer 148, which reduces the risk of the third photoresist layer 142 hardening during ion implantation. As a result, the third photoresist layer 142 and the fourth photoresist layer 148 can be easily removed.

As mentioned above, the semiconductor beveled structure 124 discussed herein can be employed in for forming a JTE of various semiconductor devices. To that end, additional processing steps can be carried out for the formation of various semiconductor devices.

Figures 8, 9:
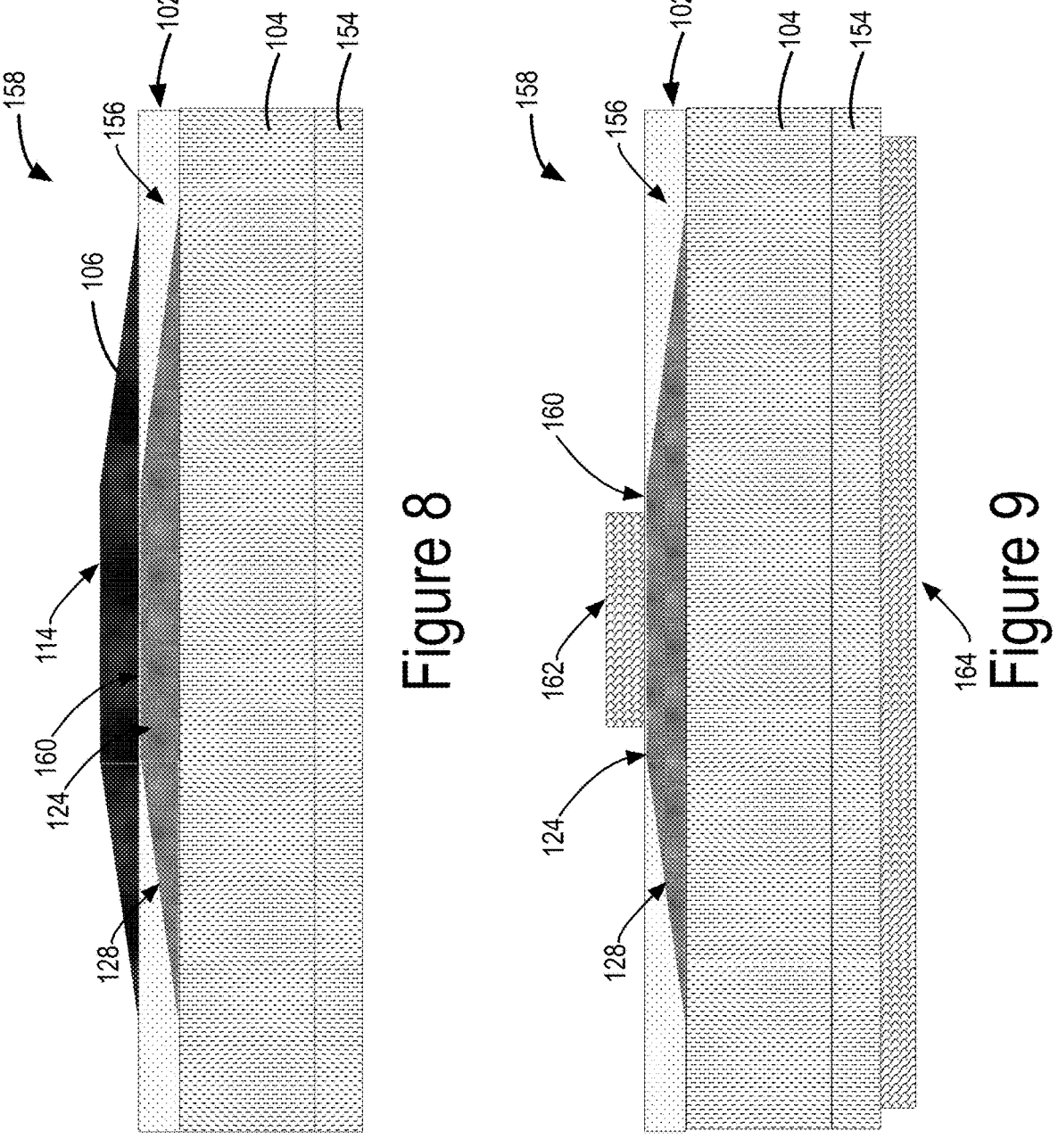
FIGS. 8 and 9 show cross-sectional views of formation of a portion of a PN diode including the semiconductor beveled structure as a JTE.

FIGS. 8 and 9 show cross-sectional views of formation of a portion of a PN diode 158 including the semiconductor beveled structure 124 as a JTE. In particular, FIG. 8 shows a process stage after ion implantation and removal of any photoresist masks used during ion implantation. The PN diode 158 may also include a third semiconductor region 154 positioned such that the second semiconductor region 104 is between the third semiconductor region 154 and the first semiconductor region 102. The third semiconductor region 154 can have a conductivity type that is the same as the conductivity type of the underlying second semiconductor region 104. In some instances, the carrier density of the third semiconductor region 154 can be different form the carrier density of the underlying second semiconductor region 104. For example, the carrier density of the third semiconductor region 154 can be greater than the carrier density of the underlying second semiconductor region 104. The first semiconductor region 102, in response to the ion implantation can include the semiconductor beveled structure 124 having the bevel slope surface 128 and a nonconductive or insulating region 156 that was exposed to ion implantation. FIG. 8 also shows the beveled structure 114 in the dielectric layer. In some examples, the beveled structure 114 in the dielectric layer is substantially circular in shape when viewed in a direction normal to the dielectric layer. In some other examples, the beveled structure 114 in the dielectric layer is substantially rectangular in shape when viewed in a direction normal to the dielectric layer. In some other examples, the shape of the beveled structure 114 can be polygonal (regular or irregular). The shape of the beveled structure 114 can impart a similar shape to the semiconductor beveled structure 124 in the first semiconductor region 102. Thus, the semiconductor beveled structure 124 can be substantially circular, rectangular, or polygonal (regular or irregular) in shape when viewed in a direction normal to the first semiconductor region 102. The shapes of the beveled structure 114 and the semiconductor beveled structure 124 are not limited to the PN diode 158 shown in FIGS. 8 and 9 and can be attributed to other processes and devices discussed herein.

The process stage for forming the PN diode 158 can further include removing the beveled structure 114 of the dielectric layer and exposing the first semiconductor region 102 having the semiconductor beveled structure 124 with the first conductivity type and the nonconductive or insulating region 156. The semiconductor beveled structure 124 can include the bevel slope surface 128 and a substantially flat top surface 160. The process for forming the PN diode 158 can further include depositing and patterning a metal over the substantially flat top surface 160 of the semiconductor beveled structure 124 to form a first terminal 162, as shown in FIG. 9. The first terminal 162 can form an ohmic contact with the semiconductor beveled structure 124. In some examples, the first terminal 162 may cover only a portion of the substantially flat top surface 160 of the semiconductor beveled structure 124. The process for forming the PN diode 158 can further include depositing and patterning another metal over the third semiconductor region 154 to form a second terminal 164. The second terminal 164 can form an ohmic contact with the third semiconductor region 154. In some examples, the first terminal 162 can be the anode terminal and the second terminal 164 can be the cathode terminal of the PN diode 158. The formation of the JTE (the semiconductor beveled structure 124) below the first terminal 162 of the PN diode 158 can help reduce e-field crowding and thereby increase the breakdown voltage of the PN diode 158.

Figures 10, 11:
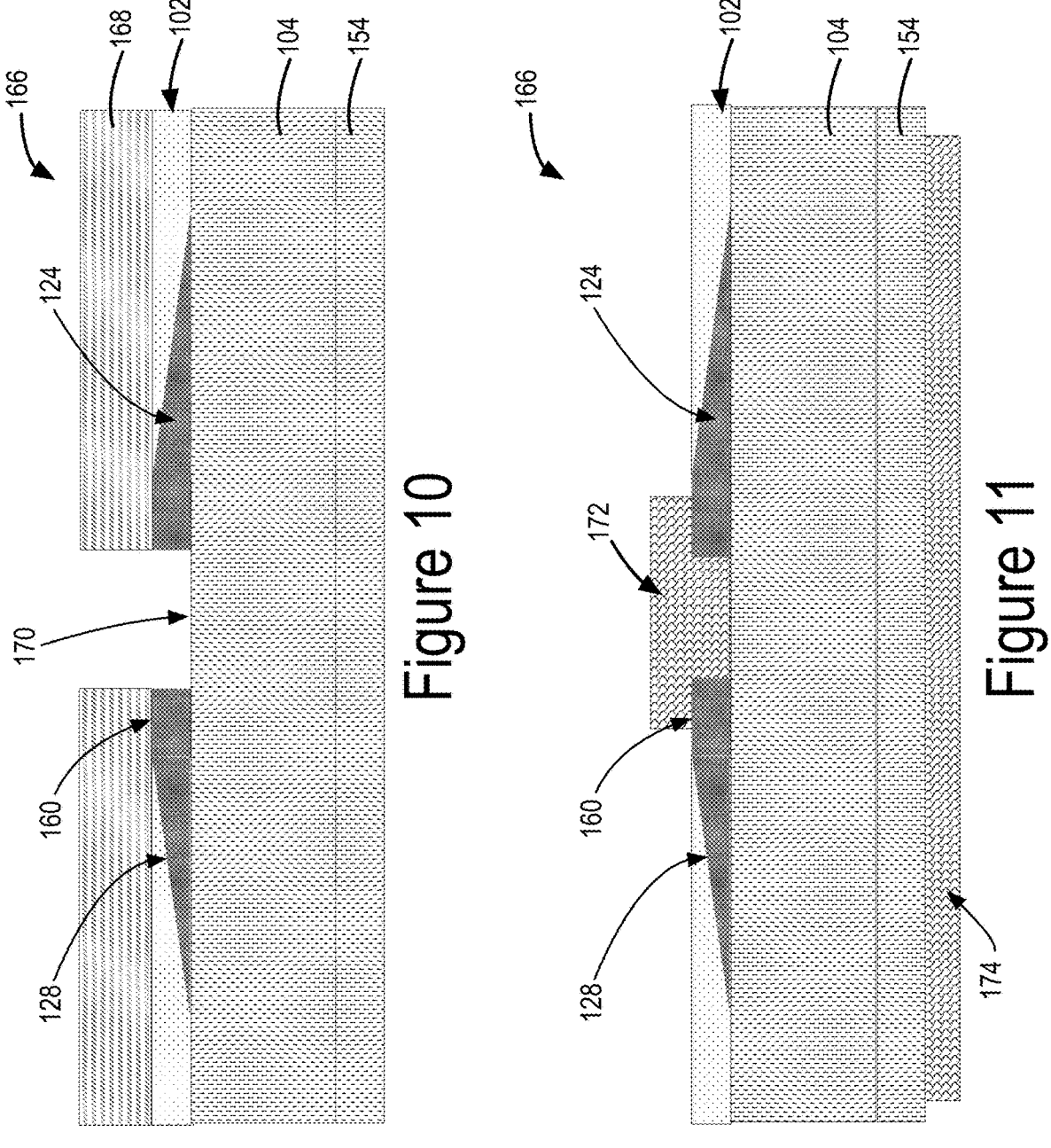
FIGS. 10 and 11 show cross-sectional views of formation of a portion of a Schottky barrier diode including the semiconductor beveled structure as a JTE.

FIGS. 10 and 11 show cross-sectional views of formation of a portion of a Schottky barrier diode 166 including the semiconductor beveled structure 124 as a JTE. In particular, FIG. 10 shows the process stage after the ion implantation and removal of the dielectric layer, the deposition and patterning of a semiconductor patterning photoresist 168 to expose a portion of the top surface 160 of the semiconductor beveled structure 124, and etching the exposed portion of the top surface 160 of the semiconductor beveled structure 124 to expose a top surface 170 of the underlying second semiconductor region 104. The first semiconductor region 102 is formed on the top surface 170 of the underlying second semiconductor region 104, which has a second conductivity type that is different form the first conductivity type of the first semiconductor region 102.

The process further includes, as shown in FIG. 11, removing the semiconductor patterning photoresist 168, and depositing and patterning a metal over the top surface 170 of the underlying second semiconductor region 104 and the top surface 160 of the semiconductor beveled structure 124. The metal can be patterned such that at least a portion of the metal is deposited over the top surface 170 and at least a portion of the metal is deposited over the substantially flat top surface 160 of the semiconductor beveled structure 124. The patterned metal can form a first terminal 172 of the Schottky barrier diode. The metal to form the first terminal 172 can be selected such that the 172 forms a Schottky contact with the underlying second semiconductor region 104 and an ohmic contact with the semiconductor beveled structure 124. The Schottky barrier diode 166 may also include a third semiconductor region 154 positioned such that the second semiconductor region 104 is between the third semiconductor region 154 and the first semiconductor region 102. The third semiconductor region 154 can have a conductivity type that is the same as the conductivity type of the underlying second semiconductor region 104. In some instances, the carrier density of the third semiconductor region 154 can be different form the carrier density of the underlying second semiconductor region 104. For example, the carrier density of the third semiconductor region 154 can be greater than the carrier density of the underlying second semiconductor region 104. The process for forming the Schottky barrier diode 166 can further include depositing and patterning another metal over the third semiconductor region 154 to form a second terminal 174. The second terminal 174 can form an ohmic contact with the third semiconductor region 154. In some examples, the first terminal 172 can be the anode terminal and the second terminal 174 can be the cathode terminal of the Schottky barrier diode 166. The formation of the JTE (the semiconductor beveled structure 124) below the first terminal 172 of the Schottky barrier diode 166 can help reduce e-field crowding and thereby increase the breakdown voltage of the Schottky barrier diode 166.

Figure 12:
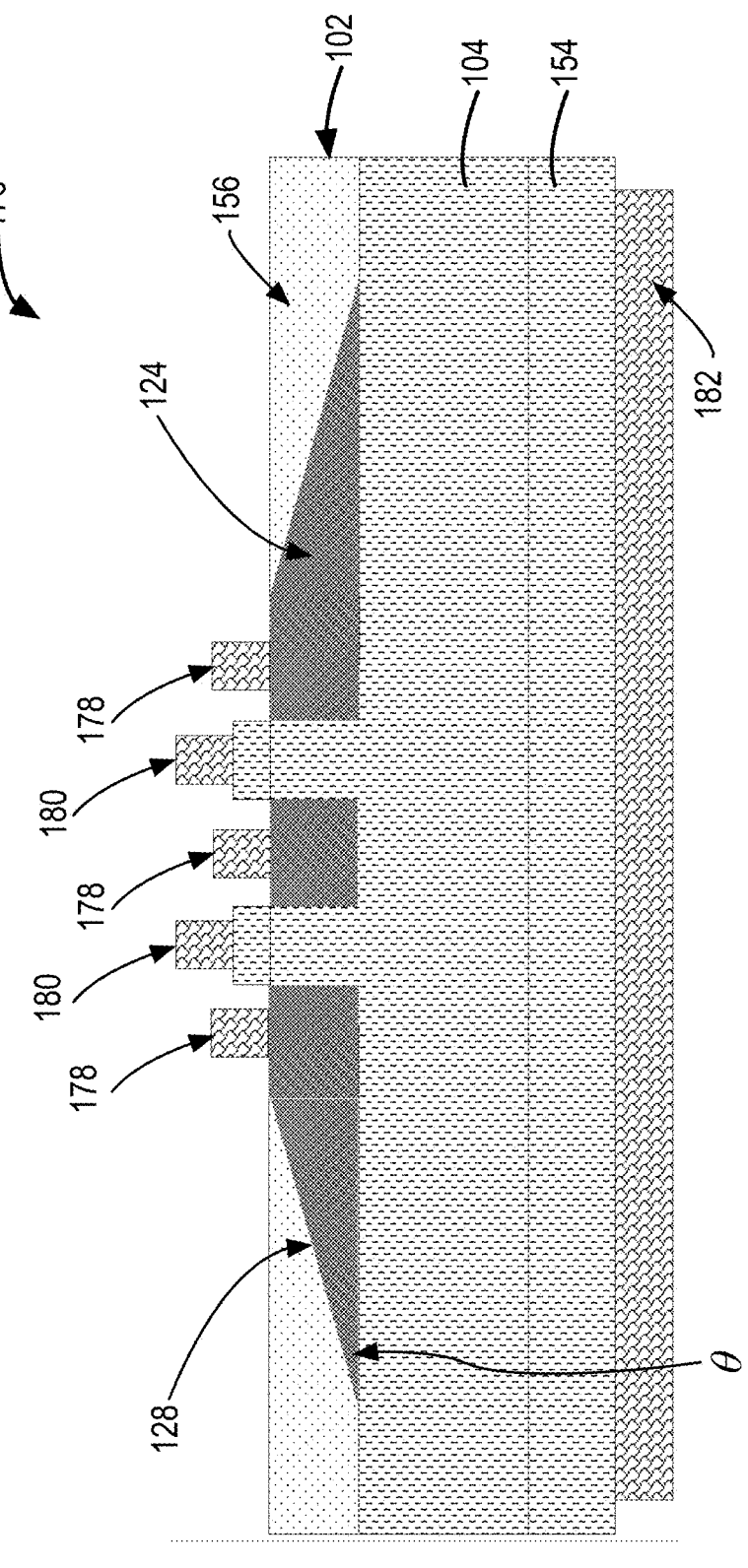
FIG. 12 shows a cross-sectional view of an example junction field effect transistor employing a semiconductor beveled structure as a JTE.

FIG. 12 shows a cross-sectional view of an example junction field effect transistor 176 employing a semiconductor beveled structure 124 as a JTE. The junction field effect transistor 176 includes the first semiconductor region 102 having the semiconductor beveled structure 124 and the nonconductive or insulating region 156. The first semiconductor region 102 is formed over the second semiconductor region 104, which, in turn, is formed over the third semiconductor region 154. Gate terminals 178 are formed over the semiconductor beveled structure 124, while a source terminal 180 are formed over regions of the second semiconductor region 104 exposed by a cavity in the semiconductor beveled structure 124. A drain terminal 182 is formed on the third semiconductor region 154. The semiconductor beveled structure 124 can be formed in a manner similar to that discussed herein in relation to FIGS. 1-7. The semiconductor beveled structure 124 can have the bevel slope surface 128 forming an angle θ that can be less than or equal to 0.1 degrees. The semiconductor beveled structure 124 helps reduce peak electric fields within the junction field effect transistor 176 and improve the reverse breakdown voltage of the junction field effect transistor 176.

Figure 13:
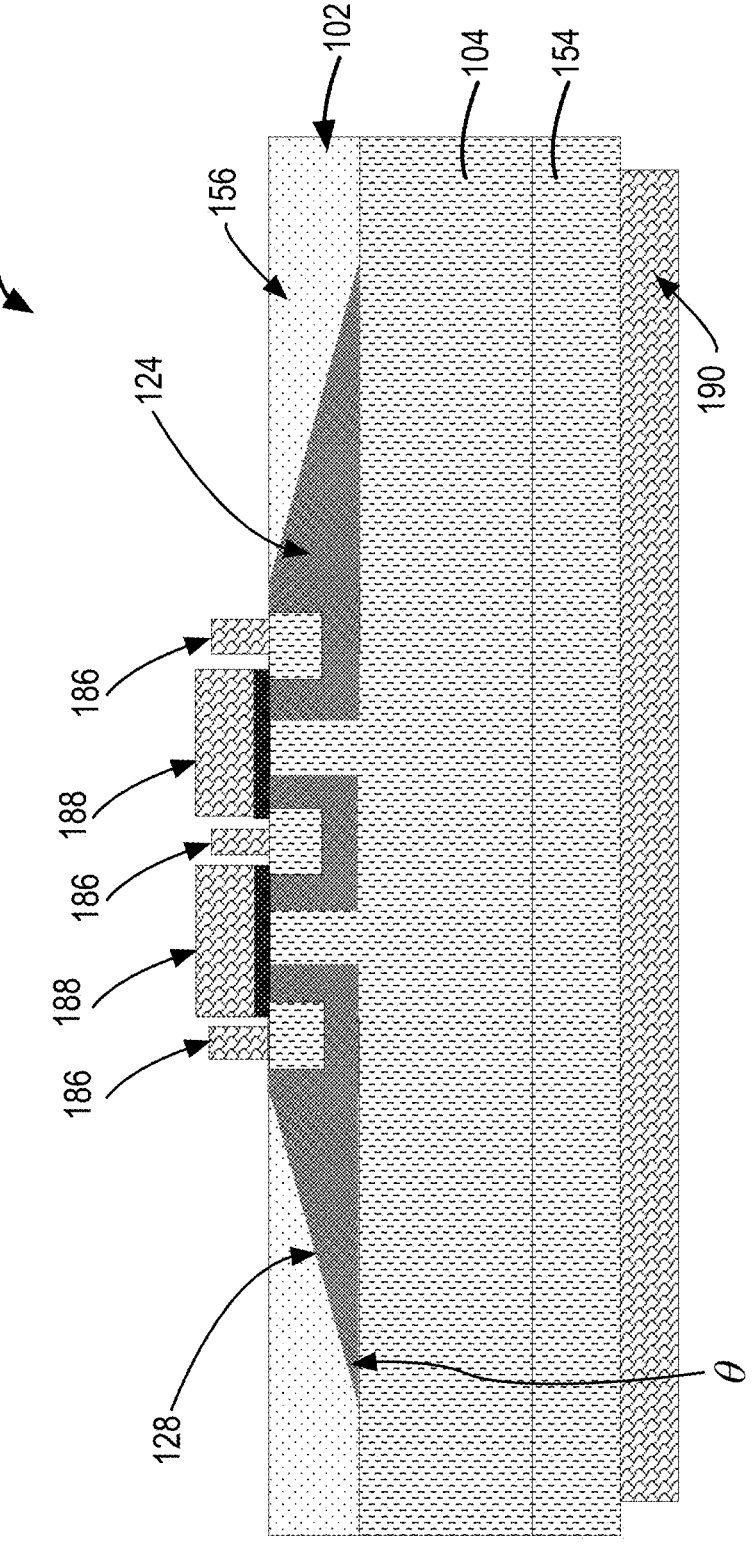
FIG. 13 shows a cross-sectional view of an example metal oxide semiconductor field effect transistor employing a semiconductor beveled structure as a JTE.

FIG. 13 shows a cross-sectional view of an example metal oxide semiconductor field effect transistor 184. The MOSFET 184 includes the first semiconductor region 102 having the semiconductor beveled structure 124 and the nonconductive or insulating region 156. The first semiconductor region 102 is formed over the second semiconductor region 104, which, in turn, is formed over the third semiconductor region 154. A gate terminal 186 is formed over regions of the second conductivity type (different from the first conductivity type of the semiconductor beveled structure 124) formed within a cavity in the semiconductor beveled structure 124. A source terminal 188 is formed over the semiconductor beveled structure 124 and over regions of the second conductivity type. The semiconductor beveled structure 124 can be formed in a manner similar to that discussed herein in relation to FIGS. 1-7. The semiconductor beveled structure 124 can have the bevel slope surface 128 forming an angle θ that can be less than or equal to 0.1 degrees. The semiconductor beveled structure 124 helps reduce peak electric fields within the MOSFET 184 and improve the reverse breakdown voltage of the MOSFET 184.

In the examples discussed herein in relation to FIGS. 1-13, the semiconductor beveled structure 124 is formed in the first semiconductor region 102 that has the same conductivity type as the semiconductor beveled structure 124. For example, referring to FIG. 3, the first semiconductor region 102 can be of p-type conductivity, and is exposed to ion implantation with dopant species of the second conductivity type (e.g., n-type) resulting in the semiconductor beveled structure 124 of the p-type conductivity. This is because, the ion implantation dopes the regions of the first semiconductor region 102 around the desired semiconductor beveled structure 124. The semiconductor beveled structure 124 is masked from the ion implantation by the beveled structure 114 in the dielectric layer 106. In another approach, the portion of the semiconductor that is doped during ion implantation can be itself used as a beveled structure.

Figure 14:
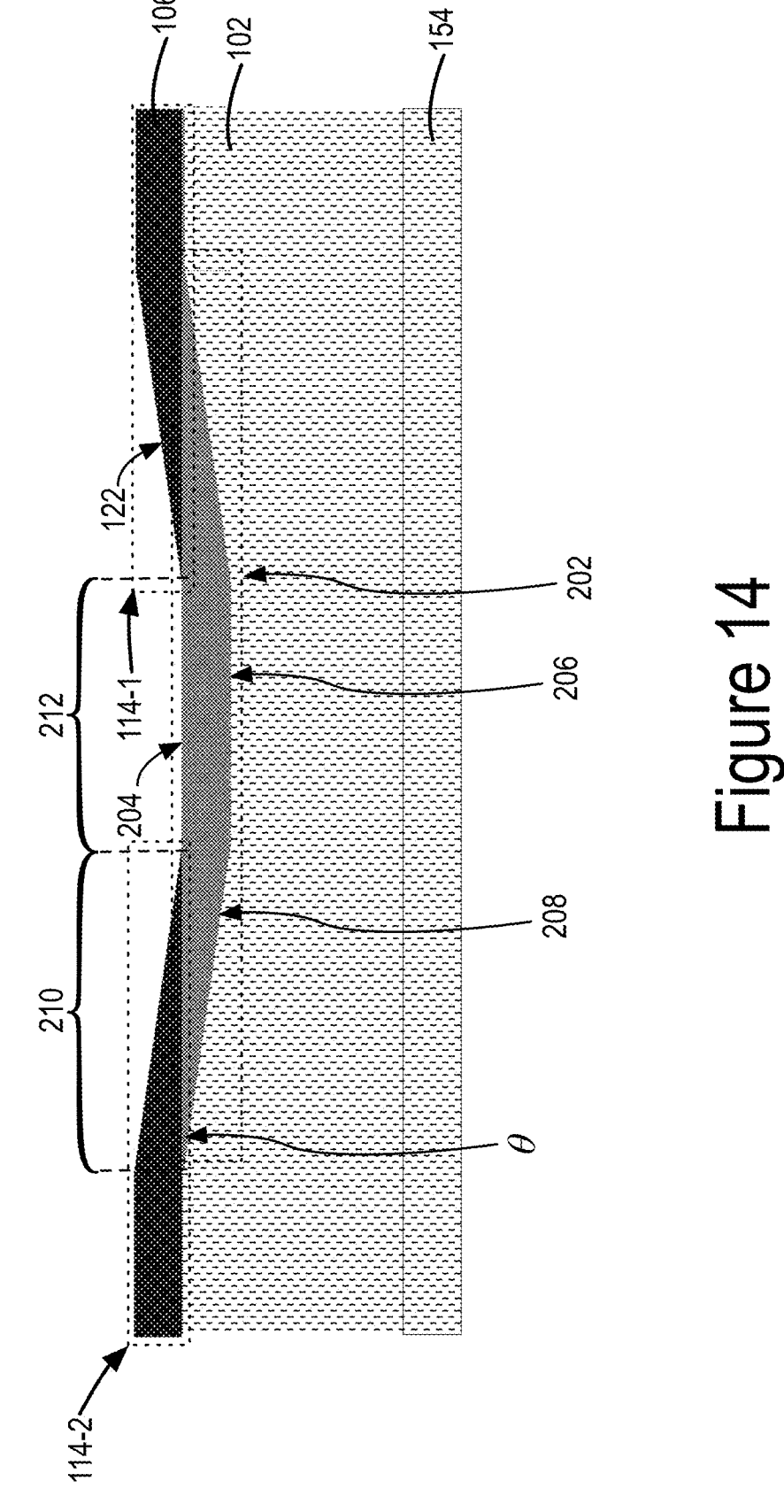
FIG. 14 shows cross-sectional view of a portion of an example semiconductor device at an example stage of fabrication.

FIG. 14 shows cross-sectional view of a portion of an example semiconductor device 200 at an example stage of fabrication. In particular, FIG. 14 shows the semiconductor device 200 after ion implantation. The process of fabrication of the semiconductor device 200 can include forming the first semiconductor region 102 of the first conductivity type. The process can further include depositing a dielectric layer 106 over the first semiconductor region 102. The process can also include forming beveled structure 114 in the dielectric layer 106 in a manner similar to that discussed herein in relation to FIG. 2. That is, the process can include depositing and patterning the first photoresist layer 108 and the second photoresist layer 110 over the dielectric layer 106 and etching the semiconductor device 200 to result in the formation of the beveled structure 114 in the dielectric layer 106. The process further includes performing ion implantation of the first semiconductor region 102 from a direction facing the dielectric layer 106 with a dopant species having a second conductivity type. Thus, if the conductivity type of the first semiconductor region 102 is n-type (p-type), the dopant species can have a p-type (n-type) conductivity.

During ion implantation, the dielectric layer 106 forms a mask, resulting in the formation of the semiconductor beveled structure 202 having a top surface 204, a bottom surface 206, and a bevel slope surface 208 that extends between the bottom surface 206 and the top surface 204. The top surface 204 can be wider than the bottom surface 206. A first portion 210 of the top surface 204 of the semiconductor beveled structure 202 is covered by the beveled structure 114 of the dielectric layer 106 and a second portion 212 of the top surface 204 is not covered by the beveled structure 114 of the dielectric layer 106. The semiconductor beveled structure 202 can have an angle θ that is formed between the bevel slope surface 208 and the top surface 204, and can be less than or equal to 0.1 degrees. The semiconductor beveled structure 202 shown in FIG. 14 can be utilized for forming JTE for various devices.

Figure 15:
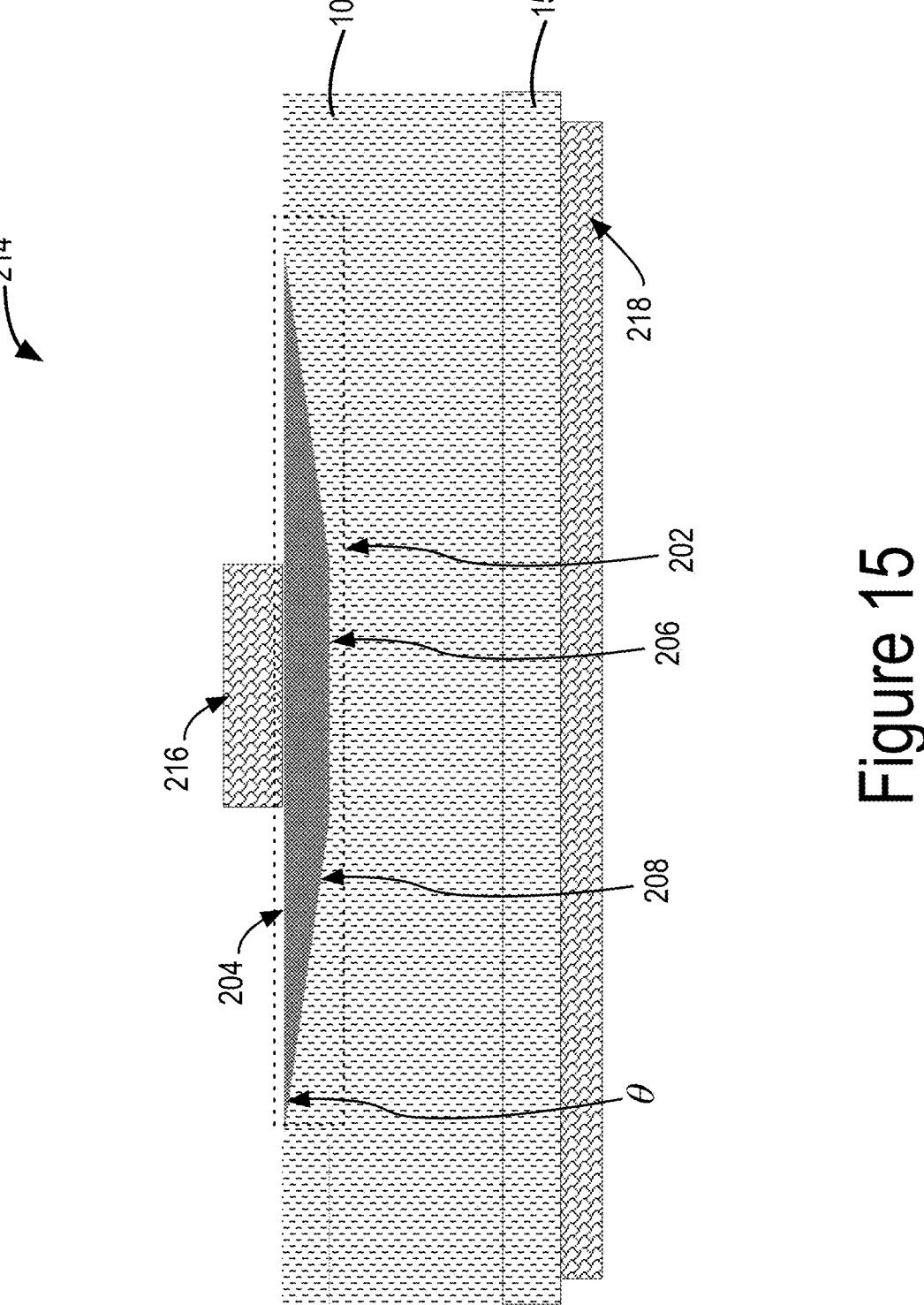
FIG. 15 shows a cross-sectional view of a PN diode utilizing the semiconductor beveled structure shown in FIG. 14 as a JTE.

FIG. 15 shows a cross-sectional view of a PN diode 214 utilizing the semiconductor beveled structure 202 shown in FIG. 14 as a JTE. In particular, FIG. 15 shows a process stage after the process stage shown in FIG. 14. The process for forming the PN diode 214, subsequent to the process stage shown in FIG. 14 can include, after performing the ion implantation, removing the dielectric layer 106 to expose the top surface 204 of the semiconductor beveled structure 202. The process can further include depositing and patterning a metal over the top surface 204 of the semiconductor beveled structure 202. The deposited and patterned metal can form a first terminal 216 of the PN diode 214. Another metal can be deposited and patterned over the third semiconductor region 154 to form a second terminal 218. In some examples, the first terminal 216 can be an anode terminal and the second terminal 218 can be a cathode terminal.

Figure 16:
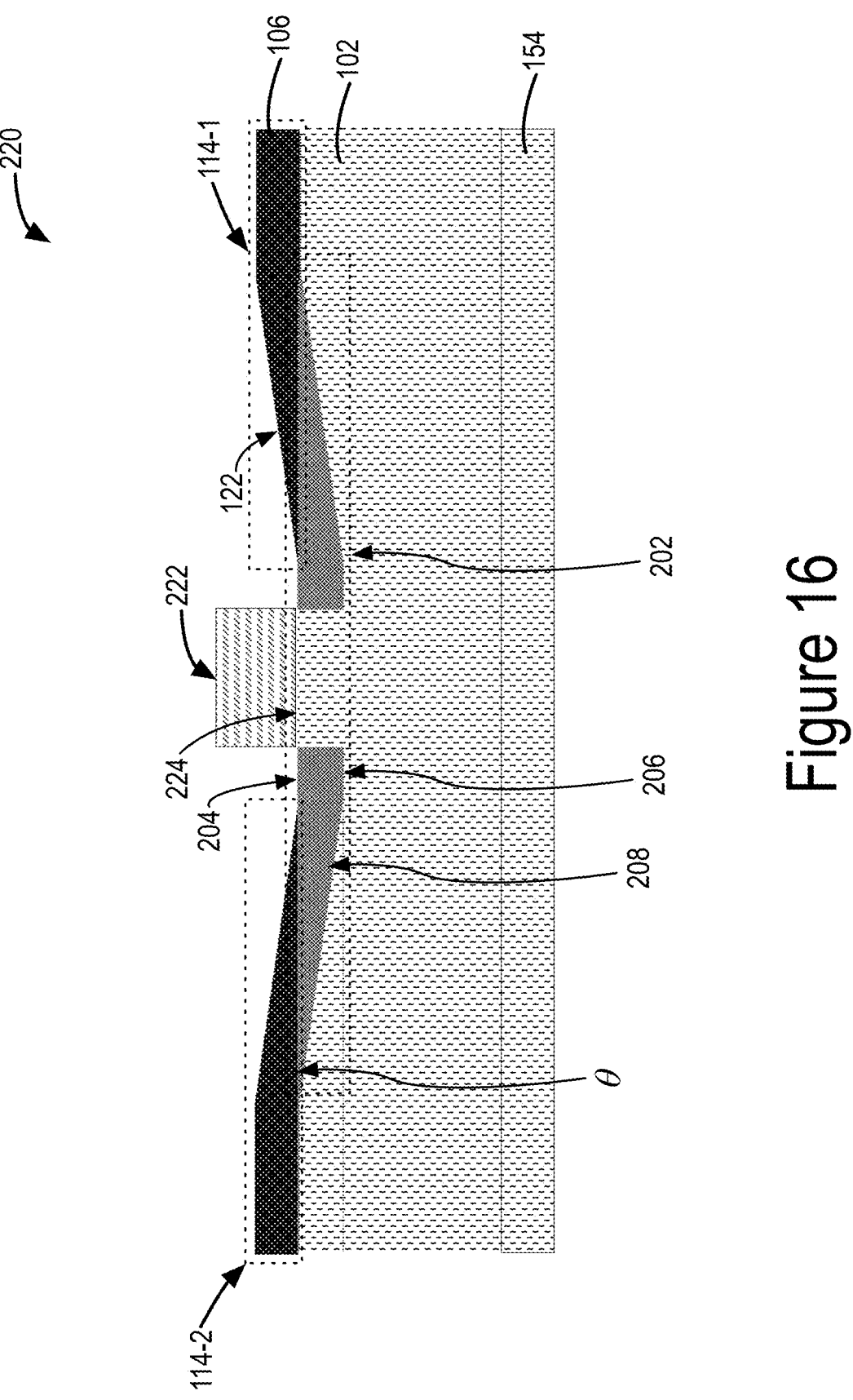
FIGS. 16 and 17 show cross-sectional views of formation of a portion of a Schottky barrier diode including the semiconductor beveled structure shown in FIG. 14 as a JTE.
Figure 17:
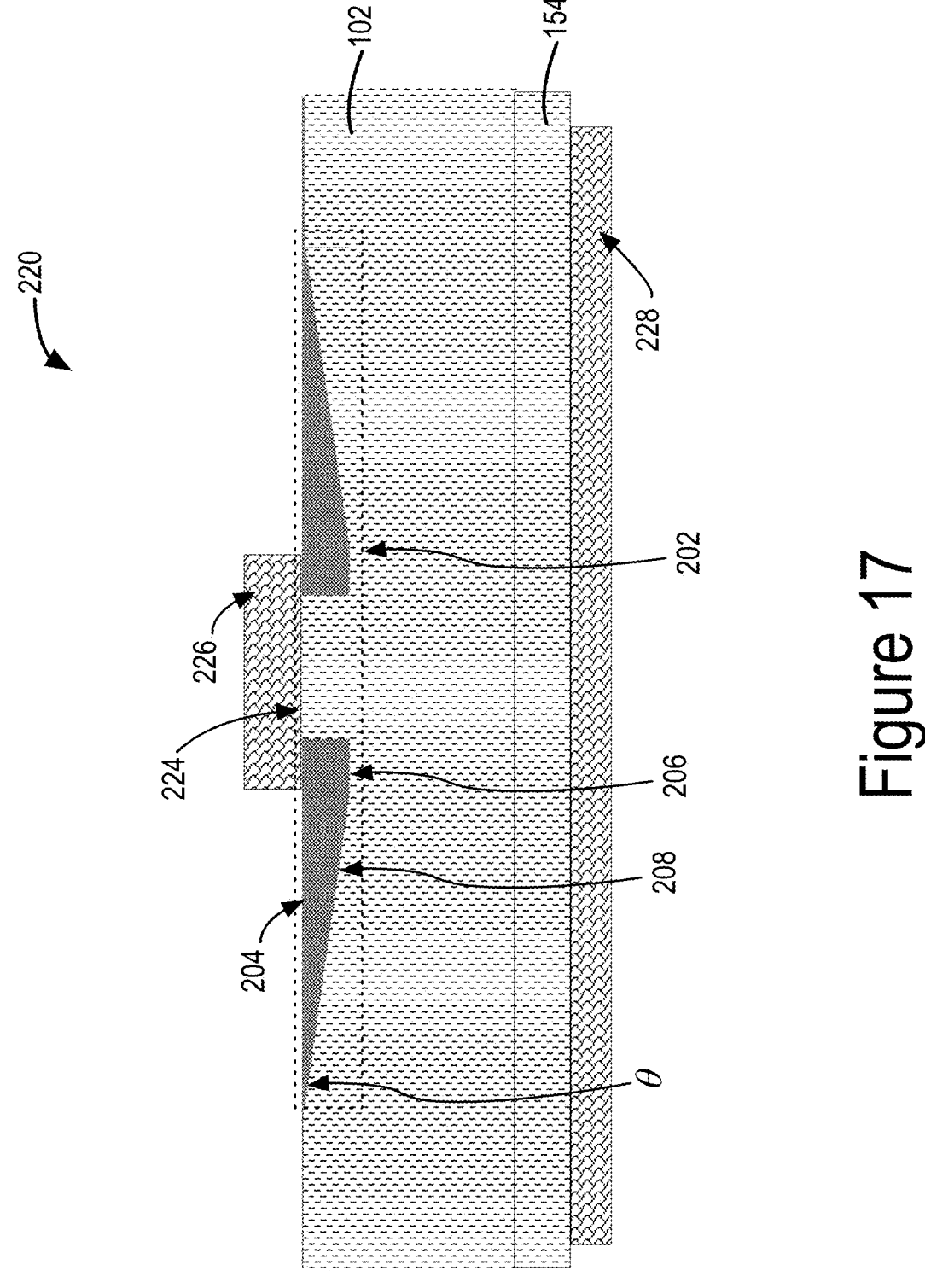

FIGS. 16 and 17 show cross-sectional views of formation of a portion of a Schottky barrier diode 220 including the semiconductor beveled structure 202 shown in FIG. 14 as a JTE. In particular, FIG. 16 shows a process stage after ion implantation where a third photoresist layer 222 is deposited and patterned to cover a portion of the top surface 224 of the first semiconductor region 102. Prior to ion implantation, the process can include the deposition and the patterning of the third photoresist layer 222 to cover a portion of the top surface 224 of the 102 that is exposed by the beveled structure 114 of the dielectric layer 106. The combination of the third photoresist layer 222 and the dielectric layer 106 can form a mask for the ion implantation of the first semiconductor region 102. Performing the ion implantation can result in the formation of the semiconductor beveled structure 202 of the second conductivity type. The semiconductor beveled structure 202 can include a top surface 204 adjacent to the portion of the top surface 224 of the first semiconductor region 102 that was positioned under the third photoresist layer 222. The semiconductor beveled structure 202 can also include the bottom surface 206 and a bevel slope surface 208 that extends between the top surface 204 and the bottom surface 206 of the semiconductor beveled structure 202. The positioning of the third photoresist layer 222 can block the dopant directed towards the first semiconductor region 102 during ion implantation and cause a portion of the first semiconductor region 102 under the third photoresist layer 222 to remain as the first semiconductor region 102. Said in a different way, a cavity can be formed in the semiconductor beveled structure 202, where the cavity is occupied by the first semiconductor region 102.

FIG. 17 shows the process stage, after the process stage shown in FIG. 16, where the dielectric layer 106 and the third photoresist layer 222 are removed and a metal layer is deposited and patterned to form a first terminal 226. Specifically, the metal can be deposited and patterned such that the metal is in contact with the first semiconductor region 102 at the top surface 224 of the first semiconductor region 102 and is also in contact with the semiconductor beveled structure 202 at the top surface 204 of the semiconductor beveled structure 202. The material of the metal can be selected such that it forms a Schottky contact with the first semiconductor region 102 and the semiconductor beveled structure 202. The process can also include the deposition and patterning of another metal over the third semiconductor region 154 to form a second terminal 228. The first terminal 226 can represent the anode terminal of the Schottky barrier diode 220 and the second terminal 228 can represent the cathode terminal of the Schottky barrier diode 220. The formation of the semiconductor beveled structure 202 below the first terminal 226 can improve the breakdown voltage of the Schottky barrier diode 220.

Figure 18:
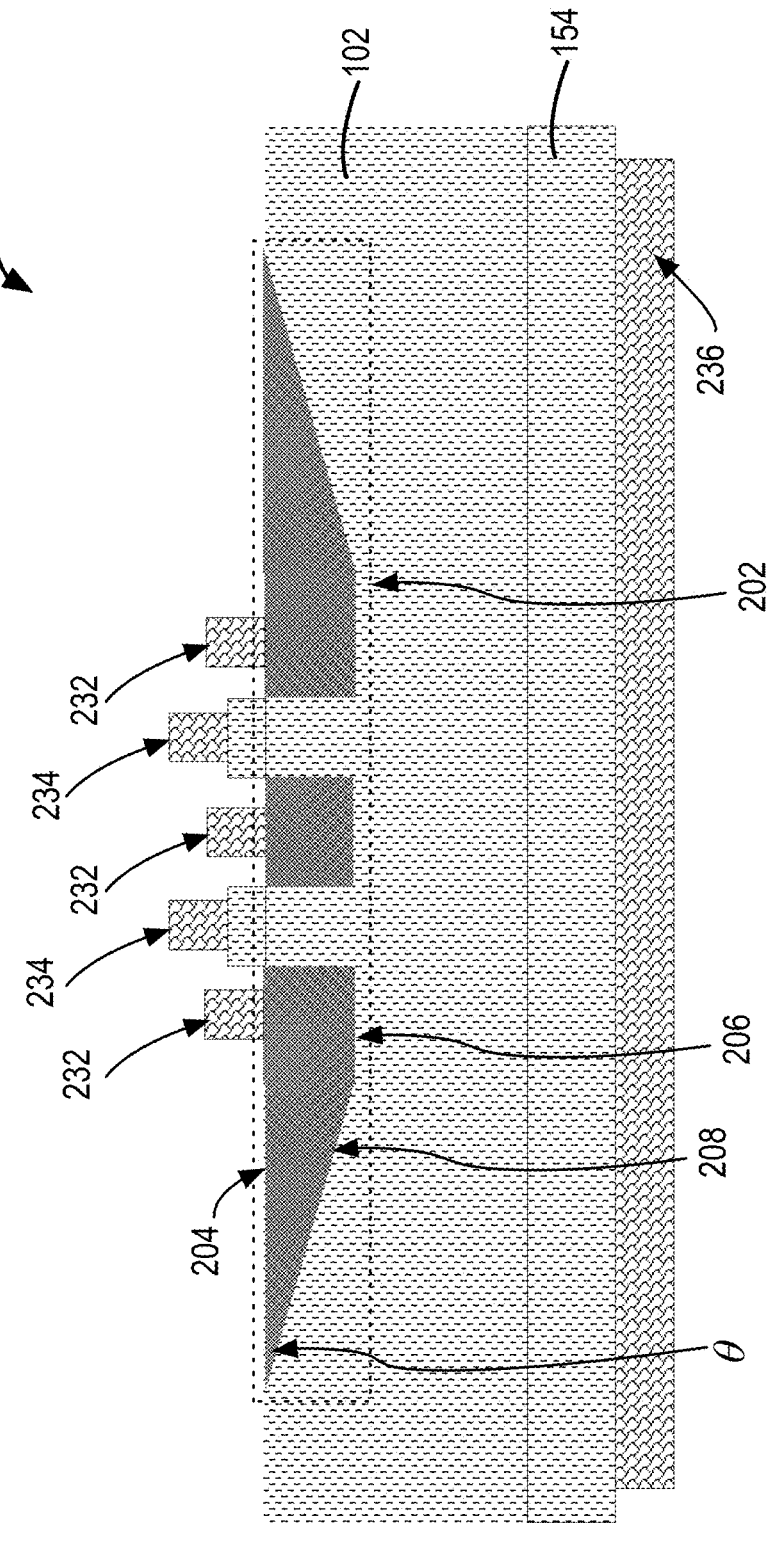
FIG. 18 shows a cross-sectional view of an example junction field effect transistor employing a semiconductor beveled structure as a JTE.

The semiconductor beveled structure 202 discussed herein in relation to FIG. 14 can be utilized as a JTE for several semiconductor devices. FIG. 18 shows a cross-sectional view of an example junction field effect transistor 230 employing a semiconductor beveled structure 202 as a JTE. The junction field effect transistor 230 includes the first semiconductor region 102 having the semiconductor beveled structure 202. The first semiconductor region 102 is formed over the third semiconductor region 154. Gate terminals 232 are formed over the semiconductor beveled structure 202, while a source terminals 234 are formed over regions of the first semiconductor region 102 exposed by a cavity in the semiconductor beveled structure 202. A drain terminal 236 is formed on the third semiconductor region 154. The semiconductor beveled structure 202 can be formed in a manner similar to that discussed herein in relation to FIGS. 14-17. The semiconductor beveled structure 202 can have the bevel slope surface 208 forming an angle θ in relation to the top surface 204 that can be less than or equal to 0.1 degrees. The semiconductor beveled structure 202 helps reduce peak electric fields within the junction field effect transistor 230 and improve the reverse breakdown voltage of the junction field effect transistor 230.

Figure 19:
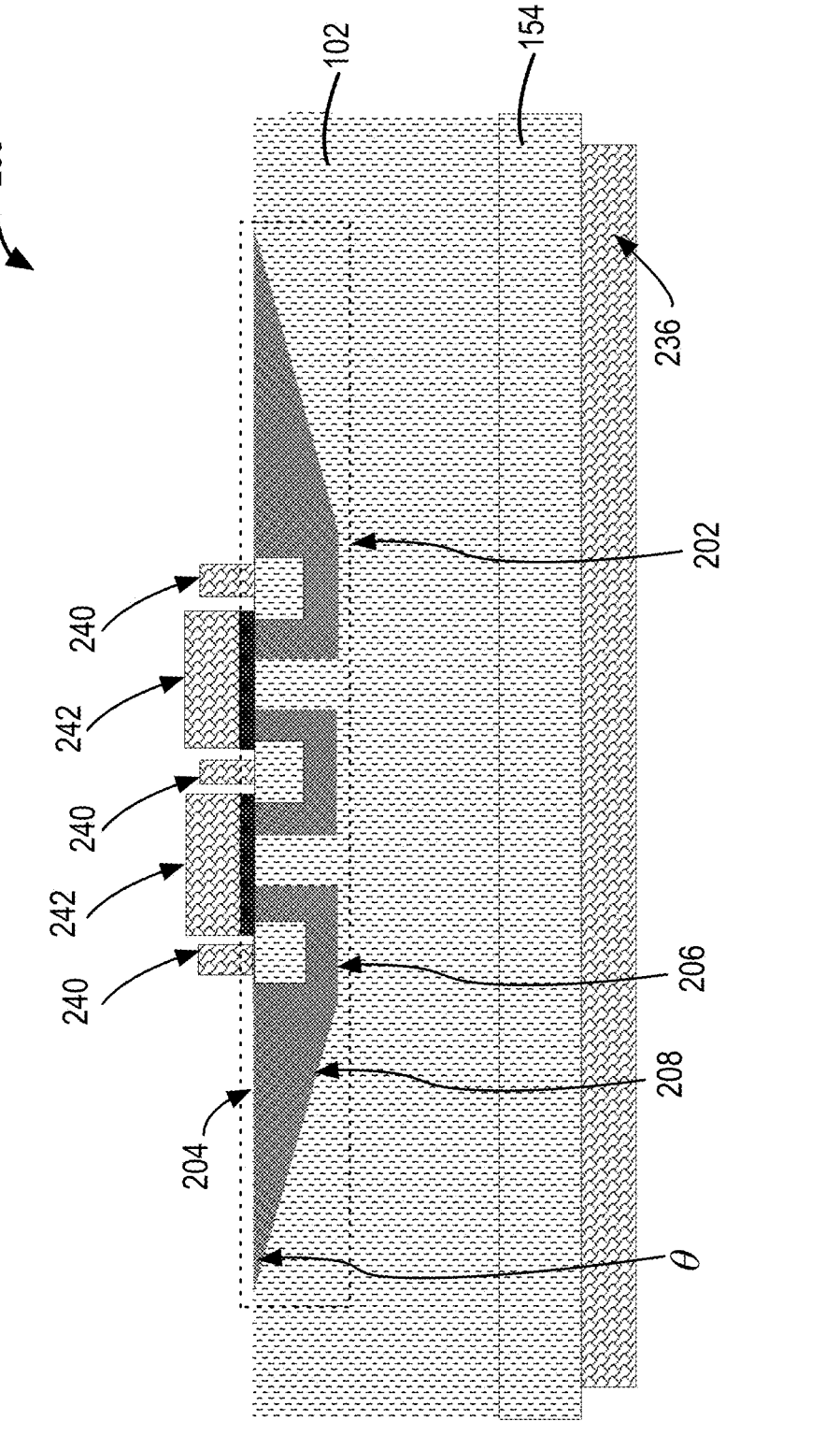
FIG. 19 shows a cross-sectional view of an example metal oxide semiconductor field effect transistor.

FIG. 19 shows a cross-sectional view of an example metal oxide semiconductor field effect transistor 238. The MOSFET 238 includes the first semiconductor region 102 having the semiconductor beveled structure 202. The first semiconductor region 102 is formed over the third semiconductor region 154. A gate terminal 240 is formed over regions of the second conductivity type (different from the first conductivity type of the semiconductor beveled structure 202) formed within a cavity in the semiconductor beveled structure 202. A source terminal 242 is formed over the semiconductor beveled structure 202 and over regions of the second conductivity type. The semiconductor beveled structure 202 can be formed in a manner similar to that discussed herein in relation to FIGS. 14-17. The semiconductor beveled structure 202 can have the bevel slope surface 208 forming an angle θ with the top surface 204 that can be less than or equal to 0.1 degrees. The semiconductor beveled structure 202 helps reduce peak electric fields within the MOSFET 238 and improve the reverse breakdown voltage of the MOSFET 238.

Additional examples of the processes and devices discussed herein can be found in M. Xiao, et al., "Robust Avalanche in 1.7 kV Vertical GaN Diodes with a Single-Implant Bevel Edge Termination," IEEE Electron Device Letters, Vol. 44, No. 10, October 2023, which is incorporated herein by reference in its entirety.

References: All cited references, patent or literature, are incorporated by reference in their entirety. The examples disclosed herein are illustrative and not limiting in nature. Details disclosed with respect to the methods described herein included in one example or embodiment may be applied to other examples and embodiments. Any aspect of the present disclosure that has been described herein may be disclaimed, i.e., exclude from the claimed subject matter whether by proviso or otherwise.

[1] Y. Zhang, F. Udrea, and H. Wang, "Multidimensional device architectures for efficient power electronics," Nature Electron., vol. 5, no. 11, pp. 723-734, November 2022, doi: 10.1038/s41928-022-00860-5

[2] K. Nomoto, Z. Hu, B. Song, M. Zhu, M. Qi, R. Yan, V. Protasenko, E. Imhoff, J. Kuo, N. Kaneda, T. Mishima, T. Nakamura, D. Jena, and H. G. Xing, "GaN-on-GaN p-n power diodes with 3.48 kV and 0.95 m-cm2: A record high figure-of-merit of 12.8 GW/cm2," in IEDM Tech. Dig., December 2015, p. 9, doi: 10.1109/IEDM.2015.7409665.

[3] Z. Bian, K. Zeng, and S. Chowdhury, "2.8 kV avalanche in vertical GaN PN diode utilizing field plate on hydrogen passivated P-layer," IEEE Electron Device Lett., vol. 43, no. 4, pp. 596-599, April 2022, doi: 10.1109/LED.2022.3149748.

[4] H. Fukushima, S. Usami, M. Ogura, Y. Ando, A. Tanaka, M. Deki, M. Kushimoto, S. Nitta, Y. Honda, and H. Amano, "Vertical GaN p-n diode with deeply etched mesa and the capability of avalanche breakdown," Appl. Phys. Exp., vol. 12, no. 2, February 2019, Art. no. 026502, doi: 10.7567/1882-0786/aafdb9.

[5] T. Maeda, T. Narita, H. Ueda, M. Kanechika, T. Uesugi, T. Kachi, T. Kimoto, M. Horita, and J. Suda, "Design and fabrication of GaN p-n junction diodes with negative beveled-mesa termination," IEEE Electron Device Lett., vol. 40, no. 6, pp. 941-944, June 2019.

[6] B. Shankar, Z. Bian, K. Zeng, C. Meng, R. P. Martinez, S. Chowdhury, B. Gunning, J. Flicker, A. Binder, J. R. Dickerson, and R. Kaplar, "Study of avalanche behavior in 3 kV GaN vertical P-N diode under UIS stress for edge-termination optimization," in Proc. IEEE Int. Rel. Phys. Symp. (IRPS), March 2022, p. 2B, doi: 10.1109/IRPS48227.2022.9764525.

[7] D. Ji, S. Li, B. Ercan, C. Ren, and S. Chowdhury, "Design and fabrication of ion-implanted moat etch termination resulting in 0.7 M Ohm cm2/1500 V GaN diodes," IEEE Electron Device Lett., vol. 41, no. 2, pp. 264-267, February 2020, doi: 10.1109/LED.2019.2960349.

[8] H. Ohta, N. Asai, F. Horikiri, Y. Narita, T. Yoshida, and T. Mishima, "Two-step mesa structure GaN p-n diodes with low ON-resistance, high breakdown voltage, and excellent avalanche capabilities," IEEE Electron Device Lett., vol. 41, no. 1, pp. 123-126, January 2020, doi: 10.1109/LED.2019.2955720.

[9] Y. Bai, W. Xu, F. Zhou, Y. Wang, L. Guo, F. Ren, D. Zhou, D. Chen, R. Zhang, Y. Zheng, and H. Lu, "Over 10 kA/cm2 inductive current sustaining capability demonstrated in GaN-on-GaN pn junction with high ruggedness," Micro Nanostruct., vol. 170, October 2022, Art. no. 207367, doi: 10.1016/j.micrna.2022.207367.

[10] P. Pandey, T. M. Nelson, W. M. Collings, M. R. Hontz, D. G. Georgiev, A. D. Koehler, T. J. Anderson, J. C. Gallagher, G. M. Foster, A. Jacobs, M. A. Ebrish, B. P. Gunning, R. J. Kaplar, K. D. Hobart, and R. Khanna, "A simple edge termination design for vertical GaN P-N diodes," IEEE Trans. Electron Devices, vol. 69, no. 9, pp. 5096-5103, September 2022, doi: 10.1109/TED.2022.3192796.

[11] H. Fu, K. Fu, S. R. Alugubelli, C.-Y. Cheng, X. Huang, H. Chen, T.-H. Yang, C. Yang, J. Zhou, J. Montes, X. Deng, X. Qi, S. M. Goodnick, F. A. Ponce, and Y. Zhao, "High voltage vertical GaN p-n diodes with hydrogen-plasma based guard rings," IEEE Electron Device Lett., vol. 41, no. 1, pp. 127-130, January 2020, doi: 10.1109/LED.2019.2954123.

[12] M. Matys, T. Ishida, K. P. Nam, H. Sakurai, K. Kataoka, T. Narita, T. Uesugi, M. Bockowski, T. Nishimura, J. Suda, and T. Kachi, "Design and demonstration of nearly-ideal edge termination for GaN p-n junction using mg-implanted field limiting rings," Appl. Phys. Exp., vol. 14, no. 7, June 2021, Art. no. 074002, doi: 10.35848/1882-0786/ac0b09.

[13] V. Talesara, Y. Zhang, V. G. T. Vangipuram, H. Zhao, and W. Lu, "Vertical GaN-on-GaN pn power diodes with baliga figure of merit of 27 GW/cm2," Appl. Phys. Lett., vol. 122, no. 12, March 2023, Art. no. 123501, doi: 10.1063/5.0135313.

[14] J. R. Dickerson, A. A. Allerman, B. N. Bryant, A. J. Fischer, M. P. King, M. W. Moseley, A. M. Armstrong, R. J. Kaplar, I. C. Kizilyalli, O. Aktas, and J. J. Wierer, "Vertical GaN power diodes with a bilayer edge termination," IEEE Trans. Electron Devices, vol. 63, no. 1, pp. 419-425, January 2016, doi: 10.1109/TED.2015.2502186.

[15] I. C. Kizilyalli, A. P. Edwards, H. Nie, D. Disney, and D. Bour, "High voltage vertical GaN p-n diodes with avalanche capability," IEEE Trans. Electron Devices, vol. 60, no. 10, pp. 3067-3070, October 2013, doi: 10.1109/TED.2013.2266664.

[16] J. Wang, L. Cao, J. Xie, E. Beam, R. McCarthy, C. Youtsey, and P. Fay, "High voltage, high current GaN-on-GaN p-n diodes with partially compensated edge termination," Appl. Phys. Lett., vol. 113, no. 2, July 2018, Art. no. 023502, doi: 10.1063/1.5035267.

[17] J. Liu, M. Xiao, R. Zhang, S. Pidaparthi, C. Drowley, L. Baubutr, A. Edwards, H. Cui, C. Coles, and Y. Zhang, "Trap-mediated avalanche in large-area 1.2 kV vertical GaN p-n diodes," IEEE Electron Device Lett., vol. 41, no. 9, pp. 1328-1331, September 2020, doi: 10.1109/LED.2020.3010784.

[18] W. Lin, M. Wang, R. Yin, J. Wei, C. P. Wen, B. Xie, Y. Hao, and B. Shen, "Hydrogen-modulated step graded junction termination extension in GaN vertical p-n diodes," IEEE Electron Device Lett., vol. 42, no. 8, pp. 1124-1127, August 2021, doi: 10.1109/LED.2021.3091335.

[19] J. Liu, R. Zhang, M. Xiao, S. Pidaparthi, H. Cui, A. Edwards, L. Baubutr, C. Drowley, and Y. Zhang, "Surge current and avalanche ruggedness of 1.2-kV vertical GaN p-n diodes," IEEE Trans. Power Electron., vol. 36, no. 10, pp. 10959-10964, October 2021, doi: 10.1109/TPEL.2021.3067019.

[20] D. Johannesson, M. Nawaz, and H.-P. Nee, "Assessment of junction termination extension structures for ultrahigh-voltage silicon carbide pin-diodes; a simulation study," IEEE J. Power Open Electron., vol. 2, pp. 304-314, 2021, doi: 10.1109/OJPEL.2021.3072486.

[21] E. A. Imhoff, F. J. Kub, K. D. Hobart, M. G. Ancona, B. L. VanMil, D. K. Gaskill, K.-K. Lew, R. L. Myers-Ward, and C. R. Eddy, "Highperformance smoothly tapered junction termination extensions for high voltage 4H—SiC devices," IEEE Trans. Electron Devices, vol. 58, no. 10, pp. 3395-3400, October 2011, doi: 10.1109/TED.2011.2160948.

[22] B. Wang, M. Xiao, J. Spencer, Y. Qin, K. Sasaki, M. J. Tadjer, and Y. Zhang, "2.5 kV vertical Ga2O3 Schottky rectifier with graded junction termination extension," IEEE Electron Device Lett., vol. 44, no. 2, pp. 221-224, February 2023, doi: 10.1109/LED.2022.3229222.

[23] J. P. Kozak, R. Zhang, M. Porter, Q. Song, J. Liu, B. Wang, R. Wang, W. Saito, and Y. Zhang, "Stability, reliability, and robustness of GaN power devices: A review," IEEE Trans. Power Electron., vol. 38, no. 7, pp. 8442-8471, July 2023, doi: 10.1109/TPEL.2023.3266365.

[24] K. Zeng and S. Chowdhury, "Designing beveled edge termination in GaN vertical p-i-n diode-bevel angle, doping, and passivation," IEEE Trans. Electron Devices, vol. 67, no. 6, pp. 2457-2462, June 2020, doi: 10.1109/TED.2020.2987040.

[25] SRIM & TRIM. Accessed: May 18, 2023. [Online]. Available: http://www.srim.org/

[26] P. Saint-Cast, D. Kania, M. Hofmann, J. Benick, J. Rentsch, and R. Preu, "Very low surface recombination velocity on p-type c-Si by high-rate plasma-deposited aluminum oxide," Appl. Phys. Lett., vol. 95, no. 15, October 2009, Art. no. 151502, doi: 10.1063/1.3250157.

[27] D. Tetzlaff, M. Dzinnik, J. Krügener, Y. Larionova, S. Reiter, M. Turcu, R. Peibst, U. H.hne, J.-D. K.hler, and T. F. Wietler, "Introducing pinhole magnification by selective etching: Application to poly-Si on ultra-thin silicon oxide films," Energy Proc., vol. 124, pp. 435-440, September 2017, doi: 10.1016/j.egypro.2017.09.270.

[28] J. Q. Han, R. S. Feng, and X. F. Wang, "Wet etching studies of PECVD silicon nitride films in doped TMAH solutions," Adv. Mater. Res., vol. 465, pp. 1-7, February 2012, doi: 10.4028/www.scientific.net/AMR.465.1.

[29] R. Zhang, J. P. Kozak, M. Xiao, J. Liu, and Y. Zhang, "Surge-energy and overvoltage ruggedness of P-gate GaN HEMTs," IEEE Trans. Power Electron., vol. 35, no. 12, pp. 13409-13419, December 2020, doi: 10.1109/TPEL.2020.2993982.

[30] D. Ji, B. Ercan, and S. Chowdhury, "Experimental determination of impact ionization coefficients of electrons and holes in gallium nitride using homojunction structures," Appl. Phys. Lett., vol. 115, no. 7, August 2019, Art. no. 073503, doi: 10.1063/1.5099245.

[31] A. Castiglia, J.-F. Carlin, and N. Grandjean, "Role of stable and metastable Mg—H complexes in p-type GaN for cw blue laser diodes," Appl. Phys. Lett., vol. 98, no. 21, May 2011, Art. no. 213505, doi: 10.1063/1.3593964.

[32] J. A. Cooper and D. T. Morisette, "Performance limits of vertical unipolar power devices in GaN and 4H—SiC," IEEE Electron Device Lett., vol. 41, no. 6, pp. 892-895, June 2020, doi: 10.1109/LED.2020.2987282.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A method, comprising:

forming a first semiconductor region having a first conductivity type, the first conductivity type being one of a p-type conductivity and a n-type conductivity;

depositing a dielectric layer over the first semiconductor region, the dielectric layer having a first etch rate;

forming a first photoresist layer over the dielectric layer, the first photoresist layer having a second etch rate that is greater than the first etch rate of the dielectric layer;

forming a second photoresist layer over the first photoresist layer;

patterning the second photoresist layer to remove a region of the second photoresist, the first photoresist layer being exposed under the region;

wet etching the first photoresist layer and the dielectric layer to form a beveled structure in the dielectric layer;

removing the first photoresist layer and the second photoresist layer; and performing ion implantation of the first semiconductor region from a direction facing the dielectric layer with dopant species having a second conductivity type, the second conductivity type being different from the first conductivity type and the other of the p-type conductivity and the n-type conductivity.

2. The method of claim 1, comprising:

prior to performing ion implantation, depositing a third photoresist layer over the dielectric layer, the third photoresist layer being patterned to expose at least a portion of the beveled structure in the dielectric layer.

3. The method of claim 1, wherein the beveled structure extends between a top surface of the first semiconductor region and a top surface of the dielectric layer that was positioned under un-etched portions of the first photoresist layer, the method comprising:

prior to performing ion implantation, depositing a third photoresist layer over the dielectric layer, the third photoresist layer being patterned to expose the beveled structure and at least a portion of the top surface of the dielectric layer.

4. The method of claim 1, comprising:

prior to performing ion implantation, depositing a third photoresist layer over the dielectric layer and a fourth photoresist layer over the third photoresist layer, patterning the third photoresist layer and the fourth photoresist layer to expose at least a portion of the beveled structure in the dielectric layer.

5. The method of claim 1, wherein the beveled structure extends between a top surface of the first semiconductor region and a top surface of the dielectric layer that was positioned under un-etched portions of the first photoresist layer, the method comprising:

prior to performing ion implantation, depositing a third photoresist layer over the dielectric layer and a fourth photoresist layer over the third photoresist layer, the third photoresist layer and the fourth photoresist layer being patterned to expose the beveled structure and at least a portion of the top surface of the dielectric layer.

6. The method of claim 1, comprising:

after performing ion implantation, removing the dielectric layer to expose the first semiconductor region having a semiconductor beveled structure with the first conductivity type and a remainder of the first semiconductor region being nonconductive, the semiconductor beveled structure having a substantially flat top surface;

depositing and patterning a metal over the top surface of the semiconductor beveled structure to form a first terminal, the first terminal forming an ohmic contact with the semiconductor beveled structure.

7. The method of claim 1, comprising:

forming the first semiconductor region over a top surface of a second semiconductor region, the second semiconductor region having the second conductivity type;

after performing ion implantation, removing the dielectric layer to expose the first semiconductor region having a semiconductor beveled structure with the first conductivity type, the semiconductor beveled structure having a top surface;

depositing a semiconductor patterning photoresist over the first semiconductor region, the semiconductor patterning photoresist being patterned to expose a portion of the top surface of the semiconductor beveled structure;

etching the exposed portion of the top surface of the semiconductor beveled structure to expose the top surface of the second semiconductor region;

removing the semiconductor patterning photoresist; and depositing and patterning a metal over the top surface of the second semiconductor region and the top surface of the semiconductor beveled structure, the metal forming a Schottky contact with the first semiconductor region and the second semiconductor region.

8. The method of claim 1, comprising:

forming in the first semiconductor region, by the ion implantation, a semiconductor beveled structure having the second conductivity type, the semiconductor beveled structure having a top surface, a bottom surface, and a bevel slope surface that extends between the top surface and the bottom surface, wherein the top surface is wider than the bottom surface, wherein at a first portion of the top surface of the semiconductor beveled structure is covered by the beveled structure of the dielectric layer and a second portion of the top surface of the semiconductor beveled structure is not covered by the dielectric layer.

9. The method of claim 8, wherein an angle formed by the bevel slope surface in relation to the top surface is less than or equal to 0.1 degree.

10. The method of claim 8, comprising:

after performing ion implantation, removing the dielectric layer to expose the top surface of the semiconductor beveled structure;

depositing and patterning a metal over the top surface of the semiconductor beveled structure, the metal forming an ohmic contact with the semiconductor beveled structure.

11. The method of claim 1, wherein the beveled structure in the dielectric layer exposes a portion of a top surface of the first semiconductor region, the method comprising:

prior to performing ion implantation, depositing and patterning a third photoresist layer to cover the portion of the top surface of the first semiconductor region exposed by the dielectric layer;

performing ion implantation with the third photoresist layer in place and forming a semiconductor beveled structure having the second conductivity type, the semiconductor beveled structure having a top surface adjacent to the portion of the top surface of the first semiconductor region positioned under the third photoresist layer, a bottom surface, and a bevel slope surface extending between the top surface and the bottom surface of the semiconductor beveled structure;

after performing ion implantation, removing the third photoresist layer to expose the portion of the top surface of the first semiconductor region;

depositing and patterning a metal over the top surface of the first semiconductor region and the top surface of the semiconductor beveled structure, the metal forming a Schottky contact with the first semiconductor region and the semiconductor beveled structure.

12. The method of claim 1, wherein the first semiconductor region includes gallium nitride.

13. The method of claim 1, wherein the beveled structure of the dielectric layer is substantially circular in shape when viewed in a direction normal to the dielectric layer.

14. The method of claim 1, wherein the beveled structure of the dielectric layer is substantially rectangular in shape when viewed in a direction normal to the dielectric layer.

15. The method of claim 1, wherein an angle formed by the beveled structure is less than or equal to 0.1 degree.

* * * * *